(12) United States Patent
Yoshibayashi

(10) Patent No.: US 11,961,860 B2
(45) Date of Patent: Apr. 16, 2024

(54) STRUCTURAL BODY, SOLID-STATE IMAGING ELEMENT, AND IMAGE DISPLAY DEVICE

(71) Applicant: FUJIFILM Corporation, Tokyo (JP)

(72) Inventor: Mitsuji Yoshibayashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 319 days.

(21) Appl. No.: 17/348,296

(22) Filed: Jun. 15, 2021

(65) Prior Publication Data

US 2021/0313372 A1 Oct. 7, 2021

Related U.S. Application Data

(63) Continuation of application No. PCT/JP2020/000007, filed on Jan. 6, 2020.

(30) Foreign Application Priority Data

Jan. 10, 2019 (JP) ................. 2019-002383
May 8, 2019 (JP) ................. 2019-088002

(51) Int. Cl.
*H01L 27/146* (2006.01)
*H04N 23/55* (2023.01)
*H04N 23/63* (2023.01)

(52) U.S. Cl.
CPC ....... *H01L 27/14627* (2013.01); *H04N 23/55* (2023.01); *H04N 23/63* (2023.01)

(58) Field of Classification Search
CPC ..................................................... H04N 23/63

(Continued)

(56) References Cited

U.S. PATENT DOCUMENTS 6,545,808 B1    4/2003   Ehbets et al.
2002/0122255 A1 9/2002   Ogusu et al.
(Continued)

FOREIGN PATENT DOCUMENTS

JP    4-199874 A     7/1992
JP    2001-511906 A  8/2001
(Continued)

OTHER PUBLICATIONS

Japanese Decision of Refusal for corresponding Japanese Application No. 2020-565727, dated Sep. 27, 2022, with an English translation.

(Continued)

*Primary Examiner* — Joel W Fosselman
(74) *Attorney, Agent, or Firm* — Birch, Stewart, Kolasch & Birch, LLP

(57) ABSTRACT

Provided are a structural body including: a light detection layer 10, a color separation layer 20 provided on a light incident side of the light detection layer 10, and an optical waveguide layer 30 provided on the light incident side of the light detection layer 10 and provided on at least one selected from a light incident side of the color separation layer 20 or a light transmitting side of the color separation layer 20, in which the optical waveguide layer 30 is a layer which transmits light incident at an angle of 0° to 40° with respect to a normal line of a light receiving surface 10a of the light detection layer 10 by changing a traveling angle of the incident light to an angle of 0° to 1° with respect to the normal line of the light receiving surface 10a of the light detection layer 10; and a solid-state imaging element and an image display device including the structural body.

18 Claims, 12 Drawing Sheets

(58) Field of Classification Search
USPC .................................................. 348/207.99
See application file for complete search history.

(56) References Cited

U.S. PATENT DOCUMENTS

| | | |
|---|---|---|
| 2004/0159774 A1 | 8/2004 | Mishina et al. |
| 2005/0122417 A1 | 6/2005 | Suzuki |
| 2006/0197097 A1 | 9/2006 | Mors |
| 2007/0058394 A1 | 3/2007 | Yu |
| 2007/0146513 A1 | 6/2007 | Kurdiwa |
| 2009/0020690 A1 | 1/2009 | Toda |
| 2009/0242736 A1* | 10/2009 | Rennie .............. H01L 27/14629 438/70 |
| 2012/0086093 A1 | 4/2012 | Otsuka et al. |
| 2012/0242873 A1 | 9/2012 | Toumiya et al. |
| 2017/0207268 A1 | 7/2017 | Kurokawa |

FOREIGN PATENT DOCUMENTS

| | | |
|---|---|---|
| JP | 2002-189112 A | 7/2002 |
| JP | 2004-253568 A | 9/2004 |
| JP | 2005-142510 A | 6/2005 |
| JP | 2006-245101 A | 9/2006 |
| JP | 2007-180156 A | 7/2007 |
| JP | 2009-15315 A | 1/2009 |
| JP | 2009-238942 A | 10/2009 |
| JP | 2010-204154 A | 9/2010 |
| JP | 2010-263228 A | 11/2010 |
| JP | 2012-84608 A | 4/2012 |
| JP | 2012-204354 A | 10/2012 |
| JP | 2013-118295 A | 6/2013 |
| JP | 2014-165907 A | 9/2014 |
| WO | WO 2016/012911 A1 | 1/2016 |

OTHER PUBLICATIONS

International Preliminary Report on Patentability and Written Opinion of the International Searching Authority, with an English translation (forms PCT/IB/373, PCT/ISA/237 and PCT/IB/326, dated Jul. 22, 2021, for corresponding International Application No. PCT/JP2020/000007.

International Search Report (form PCT/ISA/210), dated Mar. 17, 2020, for corresponding International Application No. PCT/JP2020/000007, with an English translation.

Japanese Office Action for Japanese Application No. 2020-565727, dated Mar. 22, 2022, with English translation.

Japanese Notice of Reasons for Refusal for corresponding Japanese Application No. 2022-200311, dated Jan. 30, 2024, with an English translation.

* cited by examiner

STRUCTURAL BODY, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2020/000007 filed on Jan. 6, 2020, which claims priority under 35 U.S.C. § 119(a) to Japanese Patent Application No. 2019-002383 filed on Jan. 10, 2019, and Japanese Patent Application No. 2019-088002 filed on May 8, 2019. Each of the above application(s) is hereby expressly incorporated by reference, in its entirety, into the present application.

BACKGROUND OF THE INVENTION

1. Field of the Invention

The present invention relates to a structural body including a light detection layer and a color separation layer, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. As the solid-state imaging element, for example, a structural body having a light detection layer such as a photodiode and a color separation layer such as a color filter has been used.

JP2013-118295A discloses an invention relating to a solid-state imaging element, the solid-state imaging element including a plurality of light receiving sections which are formed on a semiconductor substrate; a color filter which is formed above the light receiving section and corresponds to a wavelength range of light to be incident on the light receiving section; and a laminated structure in which a periodically of light-transmitting insulating films having different refractive indexes are laminated between the light receiving section and the color filter;
  in which the laminated structure has a first light-transmitting insulating film formed on the semiconductor substrate, a second light-transmitting insulating film which is formed on the first light-transmitting insulating film and has a refractive index different from a refractive index of the light-transmitting insulating film, and a light-transmitting flattening film formed on the second light-transmitting insulating film,
  in the first light-transmitting insulating film, based on a film thickness dependence in which a refractive index at an interface with the second light-transmitting insulating film is periodically minimized as a film thickness of the first light-transmitting insulating film fluctuates, a film thickness in a region corresponding to each light receiving section of the first light-transmitting insulating film sets to be a film thickness at which a refractive index is minimized according to a center wavelength of the color filter disposed for each light receiving section, and
  in the second light-transmitting insulating film, based on a film thickness dependence in which a refractive index at an interface with the light-transmitting flattening film is periodically minimized as a film thickness of the second light-transmitting insulating film fluctuates, a film thickness in a region corresponding to each light receiving section of the second light-transmitting insulating film sets to be a film thickness at which a refractive index is minimized according to a center wavelength of the color filter disposed for each light receiving section and which absorbs fluctuations in the film thickness of the first light-transmitting insulating film.

In addition, JP2005-142510A discloses an invention relating to a solid-state imaging device, the solid-state imaging device which captures an image, including an optical member which separates an incidence ray into multiple color components; a light receiving section for each incidence ray, which is formed in a semiconductor substrate and converts each light transmitted through the optical member into an electric charge; an anti-reflection film for each incidence ray having at least two different film thicknesses, which is formed above each light receiving section and reduces a reflection of each incidence ray on a surface of each light receiving section.

SUMMARY OF THE INVENTION

In recent years, the size and number of pixels of the solid-state imaging element have been increased, and along with this, the pixel size of the color separation layer has been finer.

However, as the pixel size of the color separation layer is finer, light condensing property in the light detection layer is lowered, and the amount of light incident on the light detection layer tends to be small. In a case where the amount of light incident on the light detection layer is small, for example, the brightness tends to decrease. In addition, even in the inventions disclosed in JP2013-118295A and JP2005-142510A, there is room for further improvement in the light condensing property in the light detection layer.

Therefore, an object of the present invention is to provide a structural body, a solid-state imaging element, and an image display device, in which light condensing property in a light detection layer is excellent.

The present invention provides the following.
<1> A structural body comprising:
  a light detection layer;
  a color separation layer provided on a light incident side of the light detection layer; and
  an optical waveguide layer provided on the light incident side of the light detection layer and provided on at least one selected from a light incident side of the color separation layer or a light transmitting side of the color separation layer,
  in which the optical waveguide layer is a layer which transmits light incident at an angle of 0° to 40° with respect to a normal line of a light receiving surface of the light detection layer by changing a traveling angle of the incident light to an angle of 0° to 1° with respect to the normal line of the light receiving surface of the light detection layer.
<2> The structural body according to <1>,
  in which the optical waveguide layer is provided on the light incident side of the color separation layer.
<3> The structural body according to <1> or <2>, further comprising:
  a microlens provided on the light incident side of the color separation layer.

<4> The structural body according to <3>,
in which the optical waveguide layer is provided on a surface of the microlens.
<5> The structural body according to <3> or <4>,
in which the optical waveguide layer is provided between the microlens and the color separation layer.
<6> The structural body according to any one of <1> to <5>,
in which the optical waveguide layer is a layer in which a plurality of columnar structural bodies including at least one selected from $SiO_2$ or magnesium fluoride are arranged at an angle of 0° to 5.0° with respect to the normal line of the light receiving surface of the light detection layer.
<7> The structural body according to any one of <1> to <6>,
in which a surface of the optical waveguide layer on a light incident side is inclined or curved toward a predetermined direction of the structural body.
<8> The structural body according to any one of <1> to <6>,
in which a surface of the optical waveguide layer on a light incident side is inclined or curved to the light detection layer toward a center of a horizontal plane of the structural body.
<9> The structural body according to any one of <1> to <8>,
in which the color separation layer has a plurality of pixels.
<10> The structural body according to <9>,
in which a partition wall is provided between each pixel.
<11> The structural body according to <10>,
in which a refractive index of the partition wall with respect to light having a wavelength of 633 nm is 1.4 or less.
<12> The structural body according to <10> or <11>,
in which the partition wall includes silica particles.
<13> The structural body according to any one of <1> to <12>, further comprising:
a flattening layer provided on at least one surface selected from a surface of the optical waveguide layer on a light incident side or a surface of the optical waveguide layer on a light transmitting side.
<14> The structural body according to any one of <1> to <13>,
in which a surface of the structural body on a light incident side is curved.
<15> The structural body according to any one of <1> to <14>,
in which the color separation layer is divided into a plurality of parts, and
the color separation layer has two or more different types of pixels, and the same type of pixel is formed over a plurality of adjacent light detection layers.
<16> A solid-state imaging element comprising:
the structural body according to any one of <1> to <15>.
<17> An image display device comprising:
the structural body according to any one of <1> to <15>.

The present invention can provide a structural body, a solid-state imaging element, and an image display device, in which light condensing property in a light detection layer is excellent.

DESCRIPTION OF THE PREFERRED EMBODIMENTS

Figure 1:
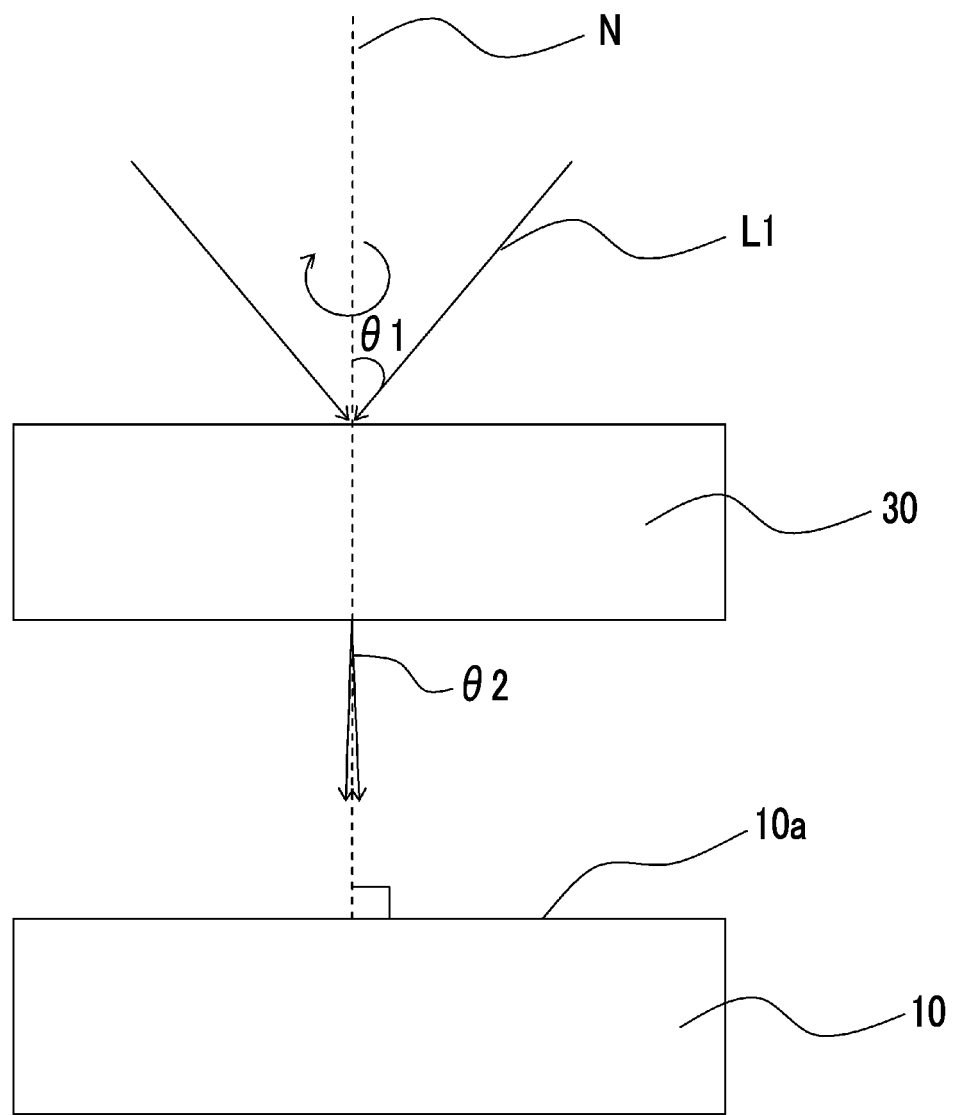
FIG. 1 is an explanatory view of an optical waveguide layer.

Hereinafter, main embodiments of the present invention will be described. However, the present invention is not limited to the specified embodiments.

In the present specification, the numerical range expressed by a symbol "to" means that the numerical values described before and after "to" are included as a lower limit value and an upper limit value, respectively.

In the present specification, a term "step" is not only an independent step, but also includes a step which cannot be clearly distinguished from other steps as long as the desired action of the step can be achieved.

In describing a group (atomic group) in the present specification, a description having no indication about substitution and non-substitution includes a description having a substituent as well as a description having no substituent. For example, in a case of being simply referred to as an "alkyl group", this means that the "alkyl group" includes both an alkyl group having no substituent (unsubstituted alkyl group) and an alkyl group having a substituent (substituted alkyl group).

In the present specification, unless specified otherwise, "exposure" denotes not only drawing using light but also drawing using particle beams such as an electron beam or an ion beam. In addition, examples of energy rays used for the exposure generally include actinic rays such as a bright-line spectrum of a mercury lamp, far ultraviolet rays typified by an excimer laser, extreme ultraviolet rays (EUV light), and X-rays, and particle beams such as electron beams and ion beams.

In the present specification, "(meth)acrylate" means either or both of "acrylate" and "methacrylate", "(meth)acryl" means either or both of "acryl" and "methacryl", and "(meth)acryloyl" means either or both of "acryloyl" and "methacryloyl".

In the present specification, a concentration of solid content in a composition is represented by a mass percentage of other components excluding a solvent with respect to the total mass of the composition.

In the present specification, unless otherwise stated, weight-average molecular weight (Mw) and number-average molecular weight (Mn) are defined in terms of polystyrene value according to gel permeation chromatography (GPC measurement). The weight-average molecular weight (Mw) and the number-average molecular weight (Mn) can be obtained, for example, by using HLC-8220 (manufactured by Tosoh Corporation) and using, as a column, GUARD COLUMN HZ-L, TSKgel Super HZM-M, TSK gel Super HZ4000, TSK gel Super HZ3000, or TSK gel Super HZ2000 (manufactured by Tosoh Corporation). In addition, unless otherwise stated, measurement is performed using tetrahydrofuran (THF) as an eluent. In addition, unless otherwise stated, detection in the GPC measurement is performed using a detector of ultraviolet rays (UV rays) having a wavelength of 254 nm.

In the present specification, unless otherwise specified, a direction in which layers are stacked on a support is referred to as "upper". Furthermore, the opposite direction is referred to as "lower". Such vertical settings are for convenience of explanation in the present specification, and in practice, an "upward" direction in the present specification may differ from the vertically upward direction.

<Structural Body>

The structural body according to an embodiment of the present invention includes a light detection layer, a color separation layer provided on a light incident side of the light detection layer, and an optical waveguide layer provided on the light incident side of the light detection layer and provided on at least one selected from a light incident side of the color separation layer or a light transmitting side of the color separation layer, in which the optical waveguide layer is a layer which transmits light incident at an angle of 0° to 40° with respect to a normal line of a light receiving surface of the light detection layer by changing a traveling angle of the incident light to an angle of 0° to 1° with respect to the normal line of the light receiving surface of the light detection layer.

Since the structural body according to the embodiment of the present invention includes the above-described optical waveguide layer, even in a case where the structural body is irradiated with light in an oblique direction, a traveling angle of the light is changed, by the optical waveguide layer, to an angle of 0° to 1° with respect to the above-described normal line. Therefore, light can be efficiently incident on the light detection layer, and light condensing property in the light detection layer is excellent. In addition, by providing such an optical waveguide layer, it is possible to improve the light condensing property in the light detection layer even in a case where the overall thickness of the structural body is small. Therefore, it is possible to form a structural body which is thin film and has excellent light condensing property.

In addition, in the related art, a microlens is disposed on the light incident side of the color separation layer to increase a light condensing rate in the light detection layer. However, since an angle of light incident on the light detection layer directly below a light source may differ from an angle of light incident on the light detection layer in a peripheral portion away from the light source, even in a case where the microlens is disposed directly above each light detection layer, the light condensing rate in the light detection layer in the peripheral portion is lower compared to the light condensing rate in the light detection layer directly below the light source. Therefore, so-called sensitivity shading may occur. Therefore, in the related art, the microlens is not provided directly above each light detection layer, but provided in an array scaled with respect to an array of the light detection layers, so that the light detection layer in the peripheral portion is disposed closer to the center than the corresponding light detection layer. On the other hand, since the structural body according to the embodiment of the present invention includes the above-described optical waveguide layer, even in a case where the microlens is further included, the scaling design can be omitted or the scaling design can be simplified. Here, the scaling design is a design in which the microlens and the color separation layer or the light detection layer are arranged so as to be displaced from each other.

In the present specification, as shown in FIG. 1, the "normal line of the light receiving surface of the light detection layer" is a straight line (normal line) N perpendicular to a light receiving surface 10a of a light detection layer 10. In addition, as shown in FIG. 1, the "light incident at an angle of 0° to 40° with respect to the normal line of the light receiving surface of the light detection layer" is a light L1 incident on an optical waveguide layer 30 at an angle (incidence angle) of θ1 (0° to 40°) with respect to the normal line N. In addition, as shown in FIG. 1, the "transmitting light by changing a traveling angle of the incident light to an angle of 0° to 1° with respect to the normal line of the light receiving surface of the light detection layer" means that the traveling angle of a light L2 of θ2 (0° to 1°) with respect to the normal line N is transmitted from the optical waveguide layer 30.

It is preferable that the optical waveguide layer is a layer which transmits light incident at an angle of 0° to 40° (preferably 0° to 45° and more preferably 0° to 50°) with respect to the normal line of the light receiving surface of the light detection layer by changing the traveling angle of the incident light to an angle of 0° to 0.9° (more preferably 0° to 0.8° and still more preferably 0° to 0.70) with respect to the above-described normal line.

The optical waveguide layer preferably has high transmittance of light having a wavelength of 380 to 1200 nm, and the transmittance of light is preferably 90% or more, more preferably 95% or more, and still more preferably 98% or more.

The refractive index of the optical waveguide layer with respect to light having a wavelength of 633 nm is preferably 1.1 to 1.4. The lower limit is preferably 1.15 or more and more preferably 1.2 or more. The upper limit is preferably 1.35 or less and more preferably 1.3 or less. In a case where the refractive index of the optical waveguide layer is within the above-described range, an effect of reducing reflection due to the difference in refractive index between air and an underlayer can be expected.

The film thickness of the optical waveguide layer is preferably 0.05 µm or more, more preferably 0.1 µm or more, and still more preferably 0.2 µm or more. In a case where the film thickness of the optical waveguide layer is 0.05 µm or more, the light condensing property in the light detection layer can be improved more effectively. From the viewpoint of lowering the height of the device, the upper limit is preferably 1 µm or less, more preferably 0.9 µm or less, and still more preferably 0.8 µm or less.

The optical waveguide layer is not particularly limited as long as the optical waveguide layer has the above-described optical characteristics. Examples of a material of the optical waveguide layer include $SiO_2$ and fluoride glass. Examples of the optical waveguide layer include a layer in which a plurality of columnar structural bodies including at least one selected from SiO$_2$ or magnesium fluoride are arranged at an angle of 0° to 5.0° (preferably 0° to 3.0°, more preferably 0° to 2.0°, and still more preferably 0° to 1.0°) with respect to the normal line of the light receiving surface of the light detection layer. Examples of a shape of the columnar structural body include a fiber shape, a column shape, a pillar shape, and a columnar shape, but the shape thereof is not limited thereto. Such an optical waveguide layer can be formed by a sputtering method such as a direct current (DC) sputtering method, a radio frequency (RF) sputtering method, and a magnetron sputtering method, or a chemical vapor deposition (CVD) method. For example, in a case of forming by the sputtering method, by installing a substrate perpendicular to a vapor deposition source and adjusting the substrate temperature and gas pressure conditions, a layer in which a plurality of the above-described columnar structural bodies are arranged at an angle of 0° to 5.0° with respect to the normal line of the light receiving surface of the light detection layer can be formed on the substrate. As a guideline for the formation conditions of the optical waveguide layer, for example, the ZONE model of Thornton model of magnetron sputtering can be referred. The ZONE model of Thornton model is described in Naoto Kikuchi, Eiji Kusano, "Thin film structure control in sputtering film formation", Journal of the Vacuum Society of Japan (vacuum), Japan Vacuum Society, 2007, Vol. 50, No. 1., pp. 15 to 21. The fact that the columnar structural bodies are arranged as described above can be confirmed by a method such as cross-sectional observation.

In a case where the optical waveguide layer is a layer in which a plurality of the above-described columnar structural bodies are arranged, the average diameter of the columnar structural bodies is preferably 90 nm or less, more preferably 70 nm or less, and still more preferably 50 nm or less. The lower limit is preferably 5 nm or more, more preferably 10 nm or more, and still more preferably 15 nm or more. The average diameter of the columnar structural bodies is a value obtained by breaking the optical waveguide layer, observing the fracture surface with an electron microscope, and measuring the dimensions. In addition, the gap between the columnar structural bodies is preferably 10 nm or less, more preferably 5 nm or less, and still more preferably 2 nm or less. The lower limit is not particularly limited, but is preferably at least the dimensional measurement limit or more for cross-sectional observation (region where an interface can be confirmed but cannot be measured as the dimension). The gap between the columnar structural bodies is the space between the columnar structural body and the adjacent columnar structural body, and is a value obtained by observing the fracture surface with an electron microscope and measuring the dimension of the space between adjacent columnar structural bodies.

In the structural body according to the embodiment of the present invention, it is preferable that the optical waveguide layer is provided on the light incident side of the color separation layer. According to this aspect, the light condensing property in the light detection layer can be improved more effectively. Furthermore, even in a case where the structural body is irradiated with light from an oblique direction with respect to the normal line of the light receiving surface of the light detection layer, light in the normal direction of the light receiving surface of the light detection layer can be incident on the color separation layer, so that light leak on the color separation layer can be suppressed and the occurrence of color mixing and the like can be effectively suppressed.

It is preferable that the structural body according to the embodiment of the present invention further includes a microlens provided on the light incident side of the color separation layer. According to this aspect, the light condensing property in the light detection layer can be improved more effectively. Furthermore, as described above, the scaling design can be omitted or the scaling design can be simplified, so that the design of the structural body is easy.

In addition, in a case where the structural body according to the embodiment of the present invention has the microlens provided on the light incident side of the color separation layer, it is also preferable that the optical waveguide layer is provided on a surface of the microlens. According to this aspect, the light condensing property in the light detection layer can be improved more effectively. Furthermore, light verticalized by the optical waveguide layer can be focused near a center of the light detection layer.

In addition, in a case where the structural body according to the embodiment of the present invention has the microlens provided on the light incident side of the color separation layer, it is also preferable that the optical waveguide layer is provided between the microlens and the color separation layer. According to this aspect, the light condensing property in the light detection layer can be improved more effectively. Furthermore, even in a case where the structural body is irradiated with light from an oblique direction with respect to the normal line of the light receiving surface of the light detection layer, light in the normal direction of the light receiving surface of the light detection layer can be incident on the color separation layer, so that light leak on the color separation layer can be suppressed and the occurrence of color mixing and the like can be effectively suppressed.

Figure 2:
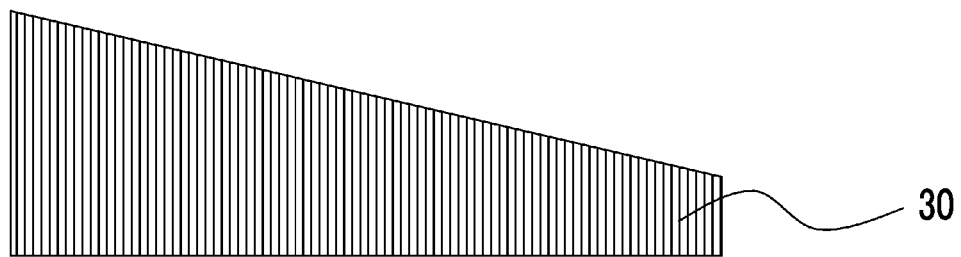
FIG. 2 is a view showing an embodiment in a state where a surface of the optical waveguide layer is inclined or curved.
Figure 3:
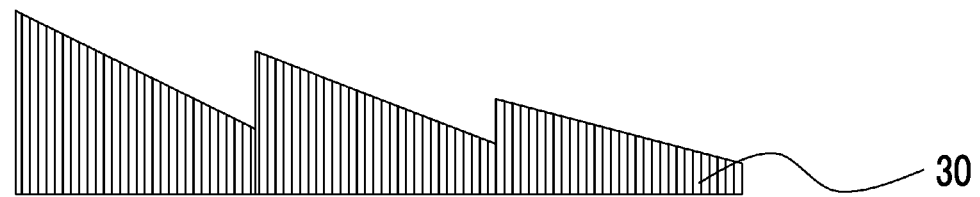
FIG. 3 is a view showing another embodiment in a state where a surface of the optical waveguide layer is inclined or curved.

In the structural body according to the embodiment of the present invention, it is preferable that the surface of the optical waveguide layer on the light incident side is inclined or curved toward a predetermined direction of the structural body, and it is more preferable that the surface of the optical waveguide layer on the light incident side is inclined or curved to the light detection layer toward a center of a horizontal plane of the structural body. According to these aspects, the light condensing property in the light detection layer can be improved effectively. In a case where the surface of the optical waveguide layer is inclined or curved as described above, the inclined surface of the optical waveguide layer 30 may have no level difference as shown in FIG. 2, or as shown in FIG. 3, a level difference may be provided on the inclined surface of the optical waveguide layer 30 and the surface of the optical waveguide layer 30 may be inclined stepwise or a series of level differences.

In addition, in the structural body according to the embodiment of the present invention, it is also preferable that the light detection layer is divided into a plurality of parts, and the color separation layer has two or more different types of pixels, and the same type of pixel is formed over a plurality of adjacent light detection layers. In this aspect, partition walls may or may not be provided between the different types of pixels. According to this structural body, light can be efficiently introduced into the light detection layer. In addition, in a case of forming the color separation layer by a photolithography method, the process likelihood can be improved.

The color separation layer of the structural body according to the embodiment of the present invention preferably has a plurality of pixels. Examples of the types of pixels include colored pixels such as red pixels, green pixels, blue pixels, yellow pixels, cyan pixels, and magenta pixels; white pixels; pixels of near-infrared cut filter; and pixels of near-infrared transmission filter.

Examples of the pixel of near-infrared cut filter include a filter layer having a maximum absorption wavelength in a wavelength range of 700 to 1800 nm. As the pixel of near-infrared cut filter, a filter layer having a maximum absorption wavelength in a wavelength range of 700 to 1300 nm is preferable, and a filter layer having a maximum absorption wavelength in a wavelength range of 700 to 1000 nm is more preferable. In addition, in the pixel of near-infrared cut filter, a transmittance of in the entire wavelength range of 400 to 650 nm is preferably 70% or more, more preferably 80% or more, and still more preferably 90% or more. In addition, the transmittance at at least one point in a wavelength range of 700 to 1800 nm is preferably 20% or less. In addition, in the pixel of near-infrared cut filter, absorbance Amax/absorbance A550, which is a ratio of an absorbance Amax at a maximum absorption wavelength to an absorbance A550 at a wavelength of 550 nm, is preferably 20 to 500, more preferably 50 to 500, still more preferably 70 to 450, and particularly preferably 100 to 400.

The pixel of near-infrared transmission filter is a filter layer which transmits at least a part of near-infrared rays. The pixel of near-infrared transmission filter may be a filter layer (transparent film) which transmits both visible light and near-infrared ray, or may be a filter layer which shields at least a part of visible light and transmits at least a part of near-infrared rays. Preferred examples of the near-infrared transmission filter layer include filter layers satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The pixel of near-infrared transmission filter is preferably a filter layer which satisfies any one of the following spectral characteristics (1) to (4).

(1): filter layer in which the maximum value of a transmittance in a wavelength range of 400 to 640 nm is 20% or less (preferably 15% or less and more preferably 10% or less) and the minimum value of a transmittance in a wavelength range of 800 to 1300 nm is 70% or more (preferably 75% or more and more preferably 80% or more).

(2): filter layer in which the maximum value of a transmittance in a wavelength range of 400 to 750 nm is 20% or less (preferably 15% or less and more preferably 10% or less) and the minimum value of a transmittance in a wavelength range of 900 to 1300 nm is 70% or more (preferably 75% or more and more preferably 80% or more).

(3): filter layer in which the maximum value of a transmittance in a wavelength range of 400 to 830 nm is 20% or less (preferably 15% or less and more preferably 10% or less) and the minimum value of a transmittance in a wavelength range of 1000 to 1300 nm is 70% or more (preferably 75% or more and more preferably 80% or more).

(4): filter layer in which the maximum value of a transmittance in a wavelength range of 400 to 950 nm is 20% or less (preferably 15% or less and more preferably 10% or less) and the minimum value of a transmittance in a wavelength range of 1100 to 1300 nm is 70% or more (preferably 75% or more and more preferably 80% or more).

The colored pixel can be formed by using a composition for forming a colored pixel, which will be described later. In addition, the white pixel can be formed by using a composition for forming a white pixel, which will be described later. In addition, the pixel of near-infrared cut filter can be formed by using a composition for forming a pixel of near-infrared cut filter, which will be described later. In addition, the pixel of near-infrared transmission filter can be formed by using a composition for forming a pixel of near-infrared transmission filter, which will be described later. Which pixel the color separation layer includes is designed according to a desired function of the structural body.

In a case where the color separation layer has a plurality of pixels, it is also preferable that a partition wall is provided between each pixel. According to this aspect, the occurrence of color mixing and the like can be more effectively suppressed. In this aspect, the refractive index of the partition wall with respect to light having a wavelength of 633 nm is preferably 1.4 or less, more preferably 1.35 or less, and still more preferably 1.30 or less. The lower limit may be, for example, 1.1 or more or 1.15 or more.

The material of the partition wall is not particularly limited. Examples thereof include organic materials such as siloxane resin and fluororesin, and inorganic particles such as silica particles, hollow silica particles, and magnesium fluoride. It is preferable that the partition wall includes silica particles. As the silica particles, particles in which a plurality of spherical silica particles are connected in a bead shape are preferably used. In the present specification, the "spherical" means that the particle may be substantially spherical and may be deformed within a range in which the effect of the present invention is exhibited. For example, the "spherical" is meant to include a shape having roughness on the surface, and a flat surface having a long axis in a predetermined direction. In addition, the "a plurality of spherical silica particles are connected in a bead shape" means a structure in which a plurality of spherical silica particles are connected in a linear and/or branched form. Examples thereof include a structure in which a plurality of spherical silica particles are connected by a joint having a smaller outer diameter. In addition, in the present invention, the structure in which "a plurality of spherical silica particles are connected in a bead shape" includes not only a ring-shaped structure, but also a chain-shaped structure with ends.

In addition, the partition wall may be formed by the optical waveguide layer in the present invention.

In addition, a protective layer may be provided on the surface of the partition wall. As a material of the protective layer, various inorganic materials and organic materials can be used. Examples of the organic material include acrylic resin, polystyrene resin, polyimide resin, and organic spin on glass (SOG) resin. In addition, the protective layer can also be formed using a composition including a compound having an ethylenically unsaturated bond-containing group. Examples of the ethylenically unsaturated bond-containing group include a vinyl group, a (meth)allyl group, a (meth)acryloyl group, and styryl group, and a (meth)allyl group or a (meth)acryloyl group is preferable. The compound having an ethylenically unsaturated bond-containing group may be either a monomer or a resin such as a polymer. Examples of the inorganic material include silicon dioxide.

The protective layer can be formed by using a known method in the related art. In a case of forming a protective layer formed of an organic material, for example, the protective layer can be formed by applying a composition including the organic material to the partition wall and drying the composition. In a case of forming a protective layer formed of an inorganic material, for example, the protective layer can be formed by forming a film formed of the inorganic material forming the protective layer on the surface of the partition wall by a vapor deposition method such as a chemical vapor deposition (CVD) and a vacuum vapor deposition, or a method such as sputtering.

The partition wall can be formed by using a known method in the related art. For example, the partition wall can be formed as follows. First, a partition wall material layer is formed on a support. The partition wall material layer can be formed, for example, by applying a composition including inorganic particles such as silica particles to the support, and then curing the composition to form a film. Examples of such a composition include compositions for forming an optical functional layer, described in paragraph Nos. 0012 to 0133 of WO2015/190374A, the contents of which are incorporated herein by reference. In addition, the partition wall material layer can be formed by forming a film formed of an inorganic material such as silicon dioxide on the support by a vapor deposition method such as a chemical vapor deposition (CVD) and a vacuum vapor deposition, or a method such as sputtering. Next, using a mask having a pattern which follows the shape of the partition wall, a resist pattern is formed on the partition wall material layer. Next, using this resist pattern as a mask, the partition wall material layer is etched to form a pattern. Examples of the etching method include a dry etching method and a wet etching method. Etching by the dry etching method can be performed under conditions described in paragraph Nos. 0114 to 0120, 0129, and 0130 of JP2016-014856A. Next, the resist pattern is peeled off from the partition wall material layer. In this way, the partition wall can be formed. In addition, in a case where the partition wall is formed by the optical waveguide layer in the present invention, the partition wall is formed by the optical waveguide layer in the present invention can be formed by forming an optical waveguide layer having the above-described characteristics on a support, forming a resist pattern on the optical waveguide layer using a mask having a pattern which follows the shape of the partition wall, etching the optical waveguide layer using this resist pattern as a mask to form a pattern, and peeling off the resist pattern from the optical waveguide layer.

It is preferable that the structural body according to the embodiment of the present invention further includes a flattening layer provided on at least one surface selected from a surface of the optical waveguide layer on a light incident side or a surface of the optical waveguide layer on a light transmitting side. According to this aspect, the light condensing property in the light detection layer can be improved more effectively. Furthermore, the flattening layer can function as a blocking film for moisture and oxygen to improve weather fastness of the structural body. It is preferable that the above-described flattening layer is provided on at least one surface of the optical waveguide layer on the light transmitting side. In a case where the flattening layer is not provided on the optical waveguide layer on the light transmitting side, the flattening layer may be formed on an uneven surface. In such a case, the surface of the optical waveguide layer may be formed with roughness, which may cause non-uniformity of the light condensing efficiency. By providing the flattening layer on the optical waveguide layer on the light transmitting side, the roughness of the partition wall or the color separation layer disposed below the flattening layer can be flattened. Therefore, it is possible to improve the light condensing efficiency of the optical waveguide layer, or to improve the above-described performance of the optical waveguide layer.

The refractive index of the above-described flattening layer with respect to light having a wavelength of 633 nm is preferably 1.5 or less and more preferably 1.45 or less. The lower limit may be, for example, 1.1 or more or 1.2 or more. The most preferred refractive index of the flattening layer is preferably a value between the refractive index of the optical waveguide layer and the refractive index of the color separation layer. As a result, reflection between each layer can be minimized in a case where the structural body is formed. In addition, the above-described flattening layer preferably has high transmittance of light in a wavelength range of 780 to 1200 nm, and the transmittance of light is more preferably 90% or more, still more preferably 95% or more, and particularly preferably 98% or more. In addition, the film thickness of the flattening layer is preferably 0.01 to 0.2 μm. The lower limit is preferably 0.02 μm or more, more preferably 0.03 μm or more, and still more preferably 0.05 μm or more. The upper limit is preferably 0.15 μm or less, more preferably 0.1 μm or less, and still more preferably 0.08 μm or less.

In addition, in a case where the flattening layer is provided on the optical waveguide layer on the light incident side, the refractive index of the flattening layer with respect to light having a wavelength of 633 nm is preferably 1.35 or less, more preferably 1.3 or less, and still more preferably 1.25 or less. The lower limit may be, for example, 1.1 or more or 1.15 or more. The most preferred refractive index of the flattening layer is preferably a value between the refractive index of air and the refractive index of the optical waveguide layer. As a result, reflection between each layer can be minimized in a case where the structural body is formed. In addition, the flattening layer preferably has high transmittance of light in a wavelength range of 780 to 1200 nm, and the transmittance of light is more preferably 90% or more, still more preferably 95% or more, and particularly preferably 98% or more. In addition, the film thickness is preferably 0.01 to 0.1 μm. The lower limit is preferably 0.02 μm or more, more preferably 0.03 μm or more, and still more preferably 0.05 μm or more. The upper limit is preferably 0.15 μm or less, more preferably 0.1 μm or less, and still more preferably 0.08 μm or less.

In addition, in a case where the flattening layer is provided on the optical waveguide layer on the light transmitting side, the refractive index of the flattening layer with respect to light having a wavelength of 633 nm is preferably 1.5 or less and more preferably 1.45 or less. The lower limit may be, for example, 1.1 or more or 1.2 or more. In addition, the flattening layer preferably has high transmittance of light in a wavelength range of 780 to 1200 nm, and the transmittance of light is more preferably 90% or more, still more preferably 95% or more, and particularly preferably 98% or more. In addition, the film thickness is preferably 0.01 to 0.2 μm. The lower limit is preferably 0.02 μm or more, more preferably 0.03 μm or more, and still more preferably 0.05 μm or more. The upper limit is preferably 0.15 μm or less, more preferably 0.1 μm or less, and still more preferably 0.08 μm or less.

The above-described flattening layer is preferably a layer including an organic material such as a siloxane resin and a fluororesin, or inorganic particles such as silica particles and hollow silica particles.

It is also preferable that the surface of the structural body according to the embodiment of the present invention on the light incident side is curved (preferably, concavely curved). According to this aspect, the light condensing property can be further enhanced. Furthermore, an effect of improving light detection uniformity of the light receiving surface by suppressing field curvature can be expected.

The structural body according to the embodiment of the present invention can be preferably used by being incorporated into a solid-state imaging element, an image display device, or the like. Examples of the image display device include a liquid crystal display device or an organic electroluminescence (organic EL) display device. In addition, the structural body according to the embodiment of the present invention can also be used by being incorporated into an image pick-up device mounted on a digital still camera, a digital video camera, a surveillance camera, an in-vehicle camera, or the like.

Hereinafter, the structural body according to the embodiment of the present invention will be described in more detail with reference to drawings.

First Embodiment

Figure 4:
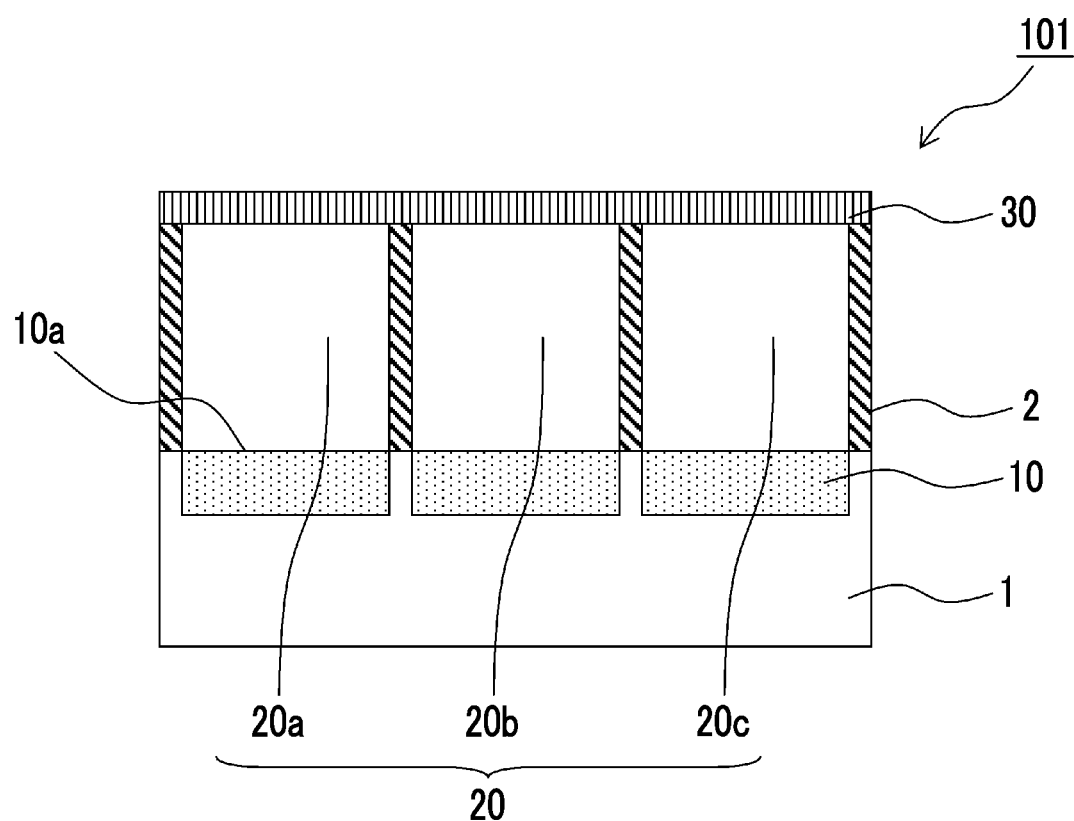
FIG. 4 is a view showing a structural body of a first embodiment.

FIG. 4 is a view showing a first embodiment of the structural body according to the present invention. A structural body 101 shown in FIG. 4 is irradiated with light from the upper side in the drawing. That is, in the structural body 101 shown in FIG. 4, from the light incident side, an optical waveguide layer 30, a color separation layer 20, and a light detection layer 10 are provided in this order.

In FIG. 4, reference 1 is a support. The material of the support 1 is not particularly limited, and can be appropriately selected according to the application. Examples thereof include a silicon substrate and an InGaAs substrate. In addition, an undercoat layer may be provided on the support 1 so as to improve adhesiveness to an upper layer, prevent the diffusion of materials, or planarize the surface of the substrate.

The light detection layer 10 is provided on the support 1 of the structural body 101 shown in FIG. 4. Examples of the light detection layer 10 include photoelectric conversion layers such as a photodiode and an organic photoelectric conversion layer. In addition, a gap may be formed between light detection layers 10 adjacent to the support 1.

A partition wall 2 is provided on the support 1. The partition wall 2 may be provided in directly contact with the support 1. In addition, in a case where an undercoat layer is provided on the support 1, the partition wall may be provided on the undercoat layer. A shape of the region surrounded by the partition wall 2 on the support 1 (hereinafter, also referred to as a shape of the opening of the partition wall) is not particularly limited. Examples thereof include a rectangular shape, a circular shape, an elliptical shape, and a polygonal shape having a pentagon or more.

The height of the partition wall 2 is preferably 0.2 to 2.0 μm. The lower limit is preferably 0.25 μm or more, more preferably 0.3 μm or more, and still more preferably 0.35 μm or more. The upper limit is preferably 1.5 μm or less, more preferably 1.2 μm or less, and still more preferably 1.0 μm or less.

The width of the partition wall 2 is preferably 0.02 to 0.5 μm. The lower limit is preferably 0.03 μm or more, more preferably 0.05 μm or more, and still more preferably 0.08 μm or more. The upper limit is preferably 0.4 μm or less, more preferably 0.3 μm or less, and still more preferably 0.2 μm or less.

The pitch width of the partition walls 2 is preferably 0.5 to 3.0 μm. The lower limit is preferably 0.6 μm or more, more preferably 0.65 μm or more, and still more preferably 0.7 μm or more. The upper limit is preferably 2.2 μm or less, more preferably 2.0 μm or less, and still more preferably 1.4 μm or less. The pitch width of the partition walls 2 is a distance between adjacent partition walls 2 on the same plane. The pitch width of the partition walls 2 corresponds to a size (line width) of the color separation layer 20 formed between the partition walls.

The color separation layer 20 is provided between the partition walls 2 and provided on the light receiving surface 10a of each light detection layer 10. In FIG. 4, the color separation layer 20 is constituted of three types of pixels (pixels 20a, 20b, and 20c). Examples of the types of pixels include colored pixels such as red pixels, green pixels, blue pixels, yellow pixels, cyan pixels, and magenta pixels; white pixels; pixels of near-infrared cut filter; and pixels of near-infrared transmission filter. Specific examples of the color separation layer 20 include an aspect in which the pixel 20a is a red pixel, the pixel 20b is a blue pixel, and the pixel 20c is a green pixel. The color separation layer 20 may be constituted of two types of pixels, or may be constituted of four or more types of pixels. In addition, the color separation layer 20 may be constituted of only one type of pixel. The number of pixels and the type of pixel in the color separation layer 20 can be appropriately selected according to the application and purpose of the structural body.

The thickness of each pixel 20a, 20b, and 20c is not particularly limited. For example, the thickness is preferably 10 μm or less, more preferably 5 μm or less, still more preferably 2 μm or less, and particularly preferably 1 μm or less. The lower limit value is preferably 0.2 μm or more, more preferably 0.3 μm or more, and still more preferably 0.35 μm or more. In addition, the thickness of each pixel 20a, 20b, and 20c is preferably 0.5 to 2.0 times the height of the partition wall 2, more preferably 0.8 to 1.5 times, and still more preferably 0.9 to 1.2 times.

Although not shown, other layers such as an undercoat layer may be provided between the light detection layer 10 and the color separation layer 20 (pixels 20a, 20b, and 20c).

As shown in FIG. 4, in the structural body 101, the optical waveguide layer 30 is provided on the color separation layer 20. That is, the structural body 101 shown in FIG. 4 has the optical waveguide layer 30 on the color separation layer 20 on the light incident side. The optical waveguide layer 30 is a layer which transmits light incident at an angle of 0° to 40° with respect to the normal line of the light receiving surface 10a of the light detection layer 10 by changing the traveling angle of the incident light to an angle of 0° to 1° the normal line of the light receiving surface 10a of the light detection layer 10. The details of the optical waveguide layer 30 are as described above.

In the structural body 101 shown in FIG. 4, the optical waveguide layer 30 is provided on the surface of the color separation layer 20, but a flattening layer may be provided between the color separation layer 20 and the optical waveguide layer 30. In addition, a flattening layer may be further provided on the surface of the optical waveguide layer 30 on the light incident side. In addition, a flattening layer may be provided between the color separation layer 20 and the optical waveguide layer 30, and on the surface of the optical waveguide layer 30 on the light incident side, respectively. It is preferable that the above-described flattening layer is provided on at least one surface of the optical waveguide layer 30 on the light transmitting side (lower side). The details of the flattening layer are as described above.

In addition, in the structural body 101 shown in FIG. 4, the optical waveguide layer 30 is provided on the color separation layer 20 only on the light incident side, but the optical waveguide layer 30 may also be provided on the color separation layer 20 on the light transmitting side.

In addition, in the structural body shown in FIG. 4, the partition wall 2 is provided between each pixel of the color separation layer 20, but the partition wall 2 may be not provided.

Second Embodiment

Figure 5:
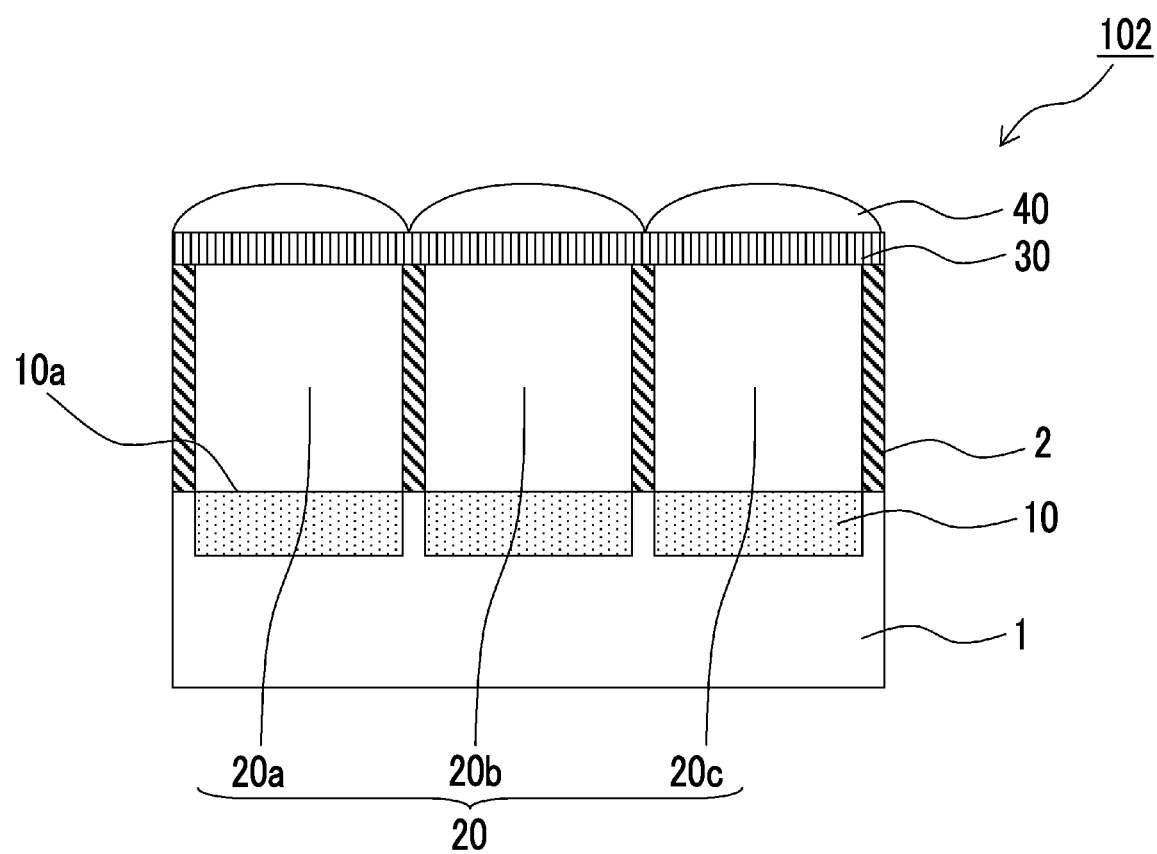
FIG. 5 is a view showing a structural body of a second embodiment.

FIG. 5 is a view showing a second embodiment of the structural body according to the present invention. A structural body 102 shown in FIG. 5 is irradiated with light from the upper side in the drawing. The structural body 102 shown in FIG. 5 is different from the above-described structural body 101 of the first embodiment in that a microlens 40 is provided on the optical waveguide layer 30. In FIG. 5, the microlens is formed on the surface of the optical waveguide layer 30, but the microlens may be formed, after forming the above-described flattening layer on the surface of the optical waveguide layer 30, on the flattening layer. In addition, although not shown, the above-described optical waveguide layer 30 may be further formed on the surface of the microlens 40. By further forming, on the microlens 40, a transparent layer having a refractive index lower than that of the microlens, it is possible to suppress reflection at an interface between the microlens and air. As the transparent layer, a $SiO_2$ layer formed by sputtering, chemical vapor deposition, or the like is generally used.

The shape of the microlens 40 shown in FIG. 5 is a semicircular lens shape, but the shape is not particularly limited, and a trapezoidal lens or a lens having a shape described in JP2014-029524A can also be used.

Third Embodiment

Figure 6:
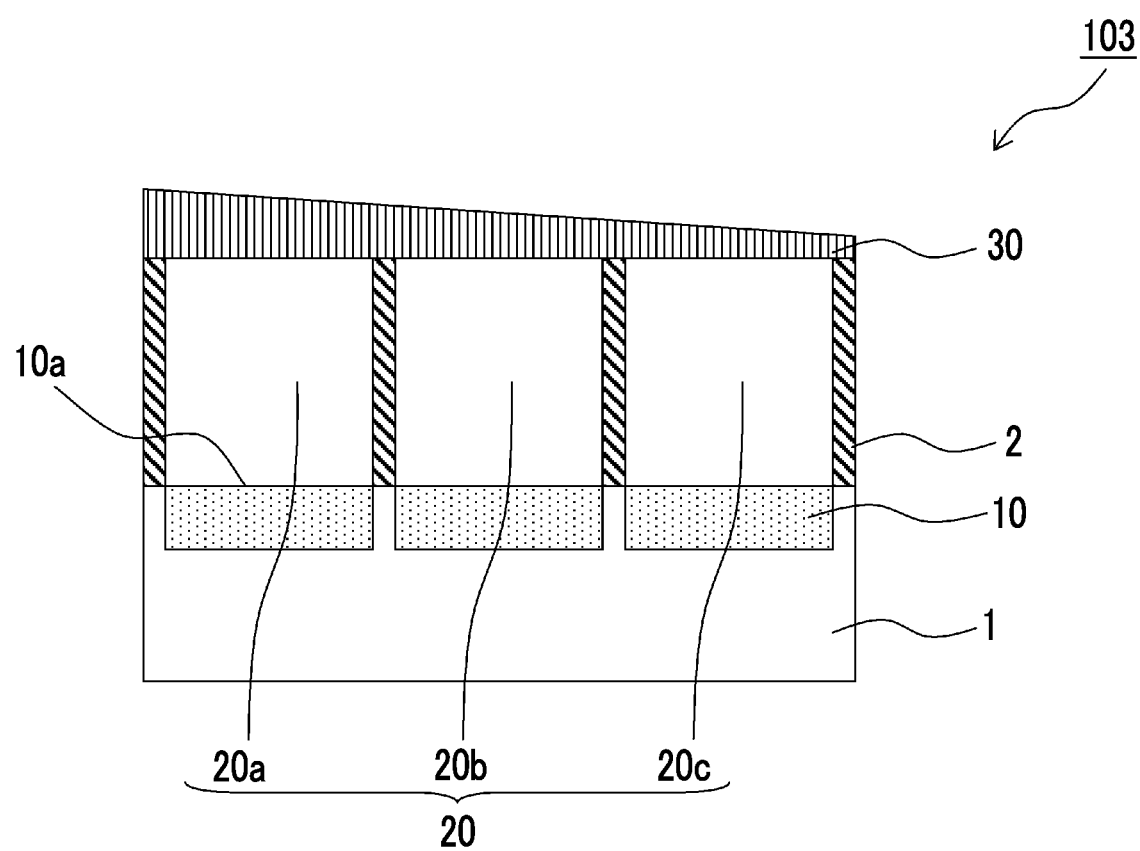
FIG. 6 is a view showing a structural body of a third embodiment.

FIG. 6 is a view showing a third embodiment of the structural body according to the present invention. A structural body 103 of FIG. 6 is irradiated with light from the upper side in the drawing. The structural body 103 is different from the above-described structural body 101 of the first embodiment in that the surface of the optical waveguide layer 30 on the light incident side is inclined or curved toward a predetermined direction of the structural body 103. In FIG. 6, the inclined surface of the optical waveguide layer 30 does not have level difference, and the surface of the optical waveguide layer 30 is inclined or curved toward the light detection layer 10 from left to right in the drawing.

Examples of an aspect of the optical waveguide layer 30 include an aspect in which the surface of the optical waveguide layer 30 is inclined or curved to the light detection layer 10 toward a center of a horizontal plane of the structural body 103.

Figure 7:
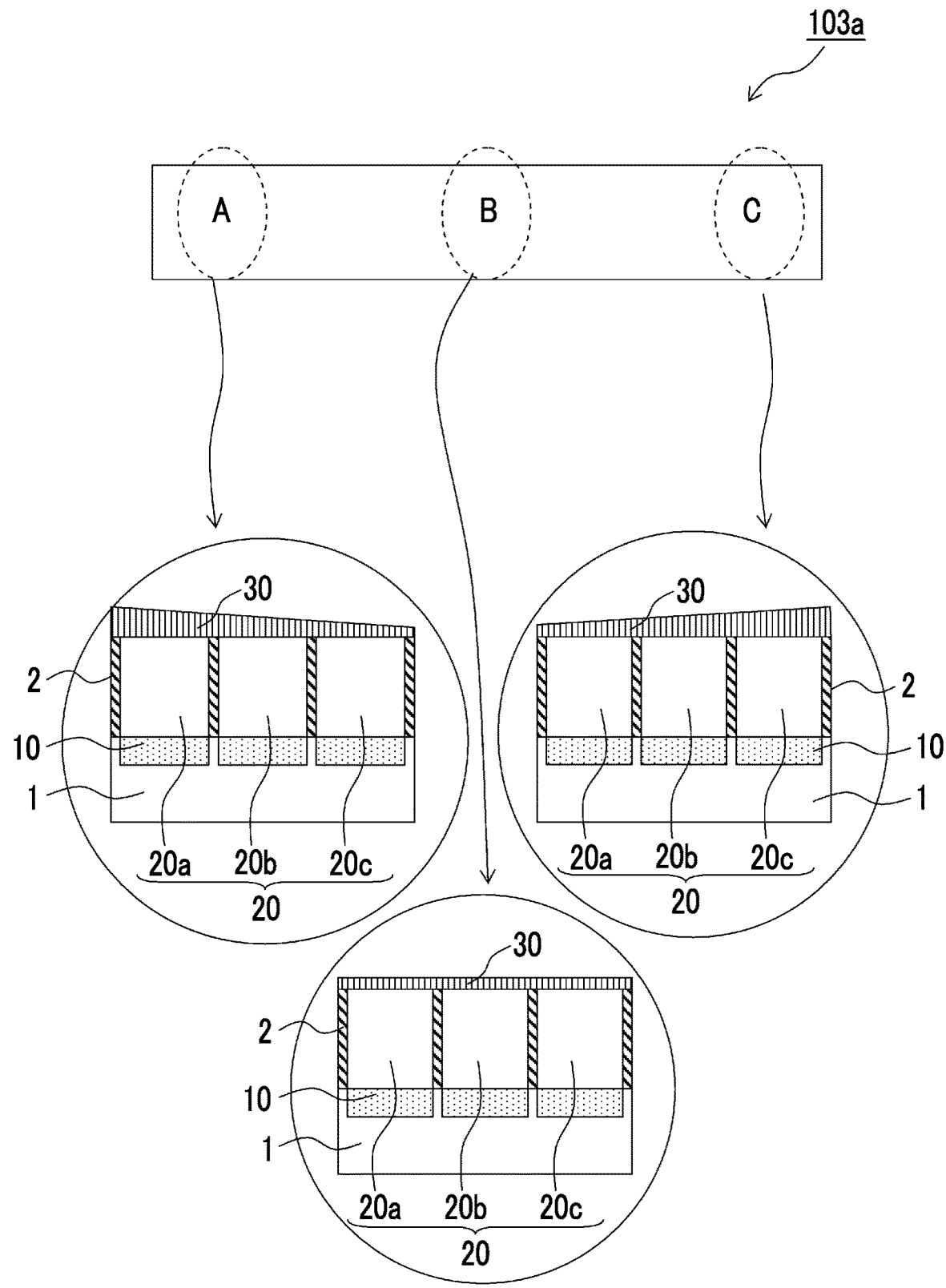
FIG. 7 is a view showing an example of an overall view of the structural body of the third embodiment.

The aspect in which the surface of the optical waveguide layer 30 is inclined or curved to the light detection layer 10 toward a center of a horizontal plane of the structural body 103 will be described with reference to FIG. 7. In a structural body 103a shown in FIG. 7, the surface of the optical waveguide layer 30 is inclined or curved toward a center (portion surrounded by a broken line B) of a horizontal plane of the structural body 103a. That is, in the peripheral portion (portion surrounded by a broken line A) on the left side of the structural body 103a, the surface of the optical waveguide layer 30 is inclined or curved to the light detection layer 10 (lower side in the drawing) toward the right, which is the center of the horizontal plane of the structural body 103a. In addition, in the peripheral portion (portion surrounded by a broken line C) on the right side of the structural body 103a, the surface of the optical waveguide layer 30 is inclined or curved to the light detection layer 10 (lower side in the drawing) toward the left, which is the center of the horizontal plane of the structural body 103a. In addition, near the center of the structural body 103a (portion surrounded by the broken line B), the surface of the optical waveguide layer 30 is substantially flat.

The aspect in which the surface of the optical waveguide layer 30 is inclined or curved toward the center (portion surrounded by the broken line B) of the structural body 103 has been described, but the surface of the optical waveguide layer 30 may be inclined or curved to the light detection layer 10 (lower side in the drawing) toward the right in the drawing, or the left in the drawing.

Fourth Embodiment

Figure 8:
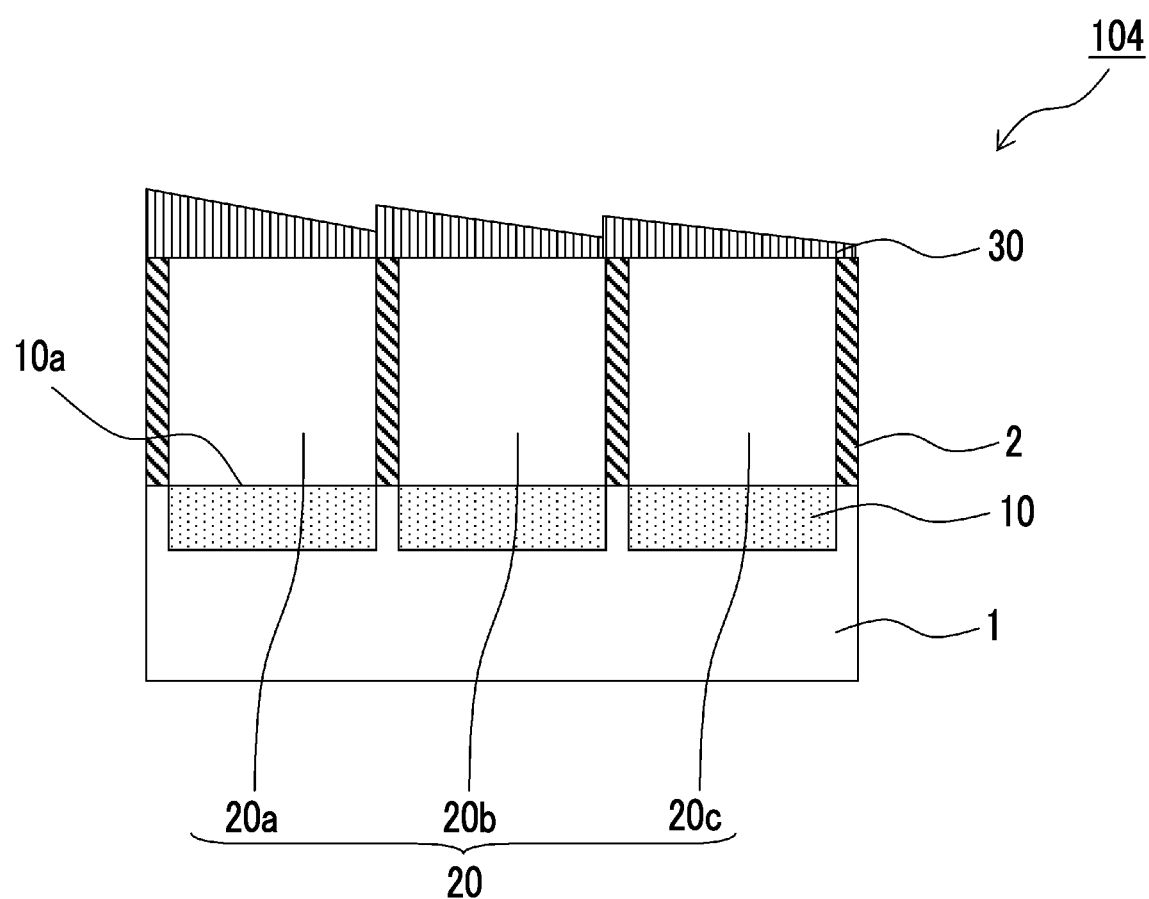
FIG. 8 is a view showing a structural body of a fourth embodiment.

FIG. 8 is a view showing a fourth embodiment of the structural body according to the present invention. A structural body 104 of FIG. 8 is irradiated with light from the upper side in the drawing. The structural body 104 is different from the above-described structural body 101 of the first embodiment in that the surface of the optical waveguide layer 30 on the light incident side is inclined stepwise toward a predetermined direction of the structural body 103. In FIG. 8, the surface of the optical waveguide layer 30 is inclined stepwise from left to right in the drawing.

Examples of an aspect of the optical waveguide layer 30 include an aspect in which the surface of the optical waveguide layer 30 is inclined stepwise to the light detection layer 10 toward a center of a horizontal plane of the structural body 104.

Figure 9:
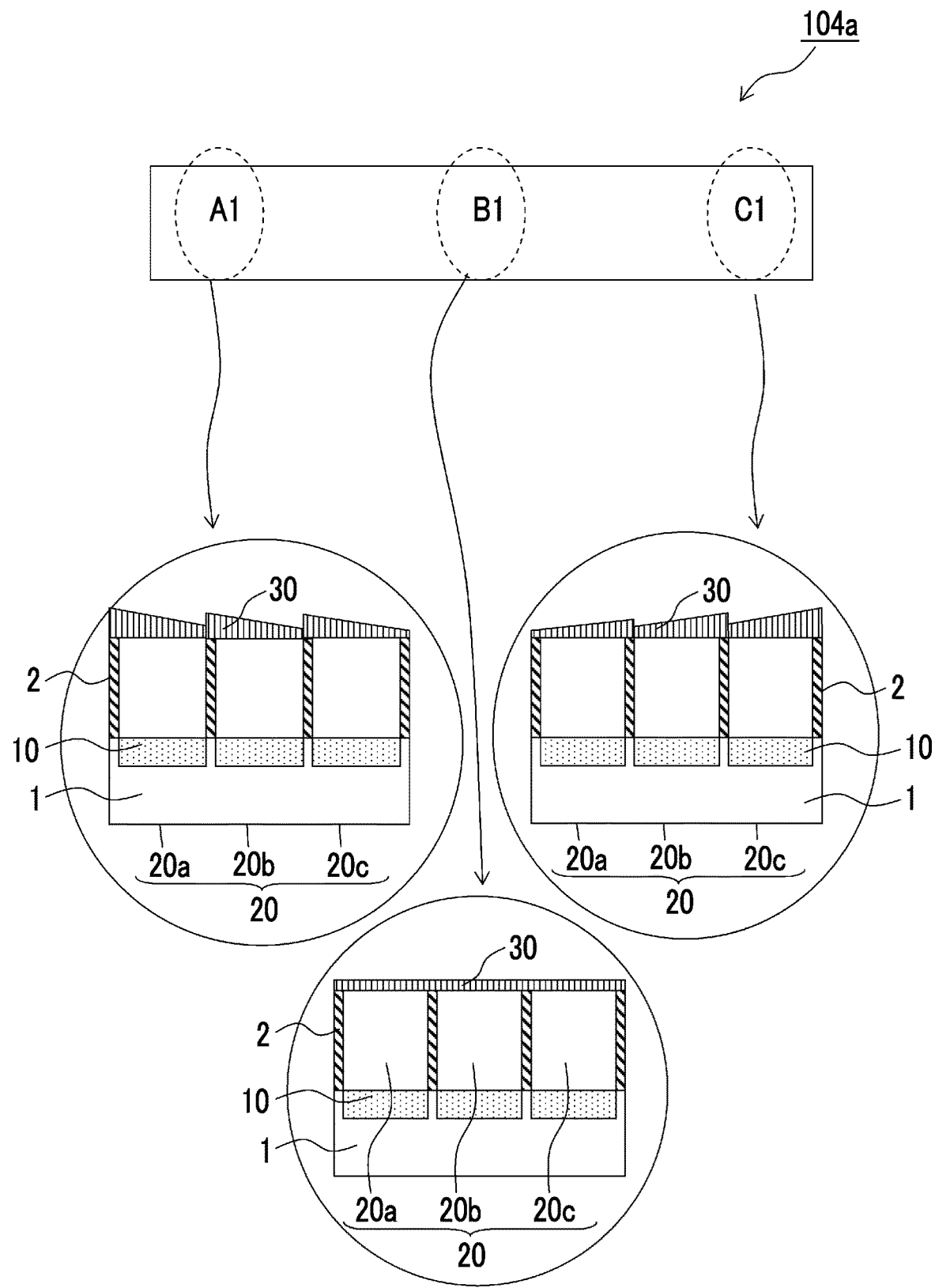
FIG. 9 is a view showing an example of an overall view of the structural body of the fourth embodiment.

The aspect in which the surface of the optical waveguide layer 30 is inclined stepwise to the light detection layer 10 toward a center of a horizontal plane of the structural body 104 will be described with reference to FIG. 9. In a structural body 104a shown in FIG. 9, the surface of the optical waveguide layer 30 is inclined or curved toward a center (portion surrounded by a broken line B1) of a horizontal plane of the structural body 104a. That is, in the peripheral portion (portion surrounded by a broken line A1) on the left side of the structural body 104a, the surface of the optical waveguide layer 30 is inclined stepwise to the light detection layer 10 (lower side in the drawing) toward the right, which is the center of the horizontal plane of the structural body 104a. In addition, in the peripheral portion (portion surrounded by a broken line C1) on the right side of the structural body 104a, the surface of the optical waveguide layer 30 is inclined stepwise to the light detection layer 10 (lower side in the drawing) toward the left, which is the center of the horizontal plane of the structural body 104a. In addition, near the center of the structural body 104a (portion surrounded by the broken line B1), the surface of the optical waveguide layer 30 is substantially flat.

Fifth Embodiment

Figure 10:
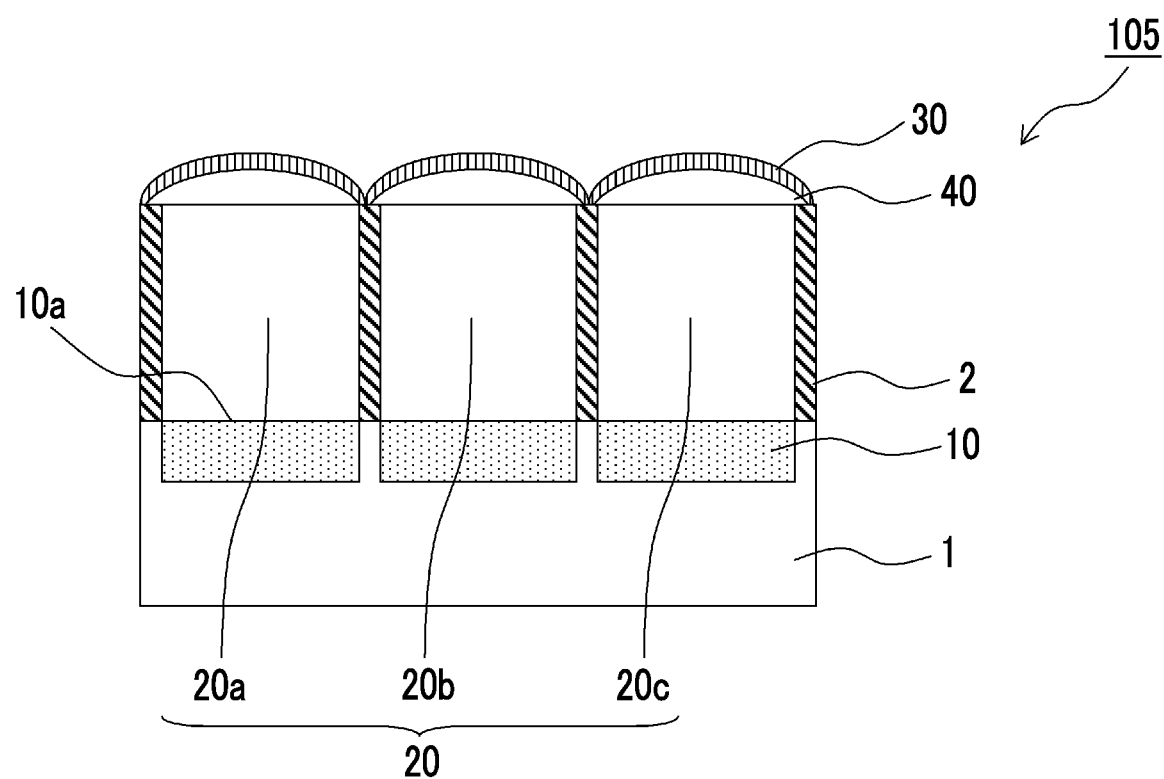
FIG. 10 is a view showing a structural body of a fifth embodiment.

FIG. 10 is a view showing a fifth embodiment of the structural body according to the present invention. A structural body 105 of FIG. 10 is irradiated with light from the upper side in the drawing. The structural body 105 is different from the above-described structural body 101 of the first embodiment in that a microlens 40 is provided on the color separation layer 20, and the optical waveguide layer 30 is provided on the surface of the microlens 40.

Sixth Embodiment

Figure 11:
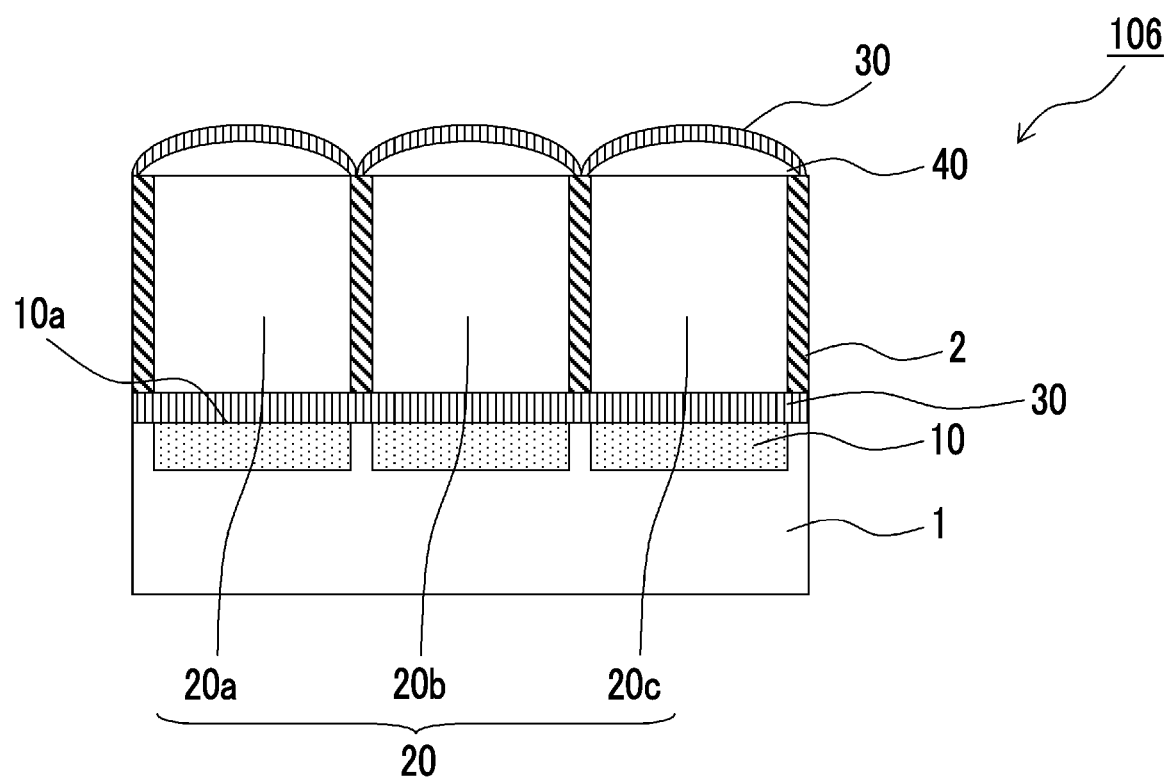
FIG. 11 is a view showing a structural body of a sixth embodiment.

FIG. 11 is a view showing a sixth embodiment of the structural body according to the present invention. A structural body 106 of FIG. 11 is irradiated with light from the upper side in the drawing. The structural body 106 is different from the above-described structural body 105 of the fifth embodiment in that the optical waveguide layer 30 is further provided between the light detection layer 10 and the color separation layer 20.

Seventh Embodiment

Figure 12:
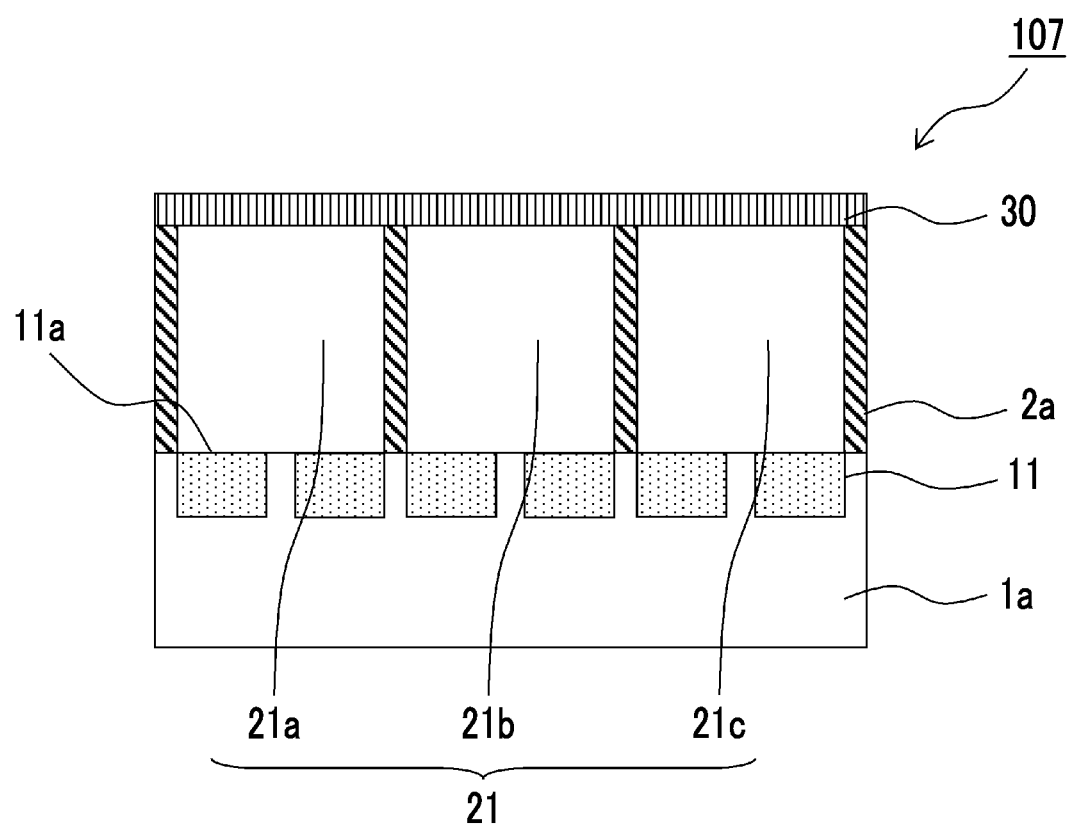
FIG. 12 is a view showing a structural body of a seventh embodiment.
Figure 13:
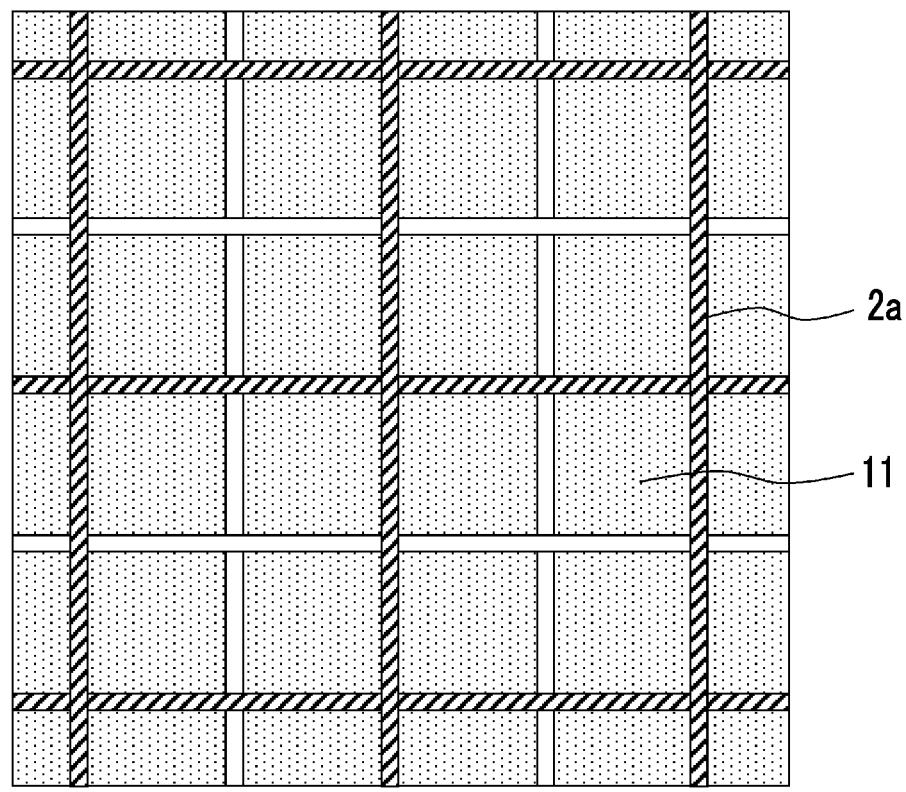
FIG. 13 is a view (plan view) showing an embodiment of a support having a partition wall, which is used for the structural body of the seventh embodiment.

FIG. 12 is a view showing a seventh embodiment of the structural body according to the present invention. A structural body 107 of FIG. 12 is irradiated with light from the upper side in the drawing. In the structural body 107, a light detection layer 11 provided on a support 1a is divided into a plurality of parts by Deep Trench or the like. A region on the support 1a, which is surrounded by partition walls 2a, has a plurality of divided light detection layers 11. FIG. 13 shows an embodiment of a support having a partition wall, which is used for the structural body 107.

The height of the partition wall 2a is preferably 0.2 to 2.0 µm. The lower limit is preferably 0.25 µm or more, more preferably 0.3 µm or more, and still more preferably 0.35 µm or more. The upper limit is preferably 1.5 µm or less, more preferably 1.2 µm or less, and still more preferably 1.0 µm or less.

The width of the partition wall 2a is preferably 0.02 to 0.5 µm. The lower limit is preferably 0.03 µm or more, more preferably 0.05 µm or more, and still more preferably 0.08 µm or more. The upper limit is preferably 0.4 µm or less, more preferably 0.3 µm or less, and still more preferably 0.2 µm or less.

The pitch width of the partition walls 2a is preferably 0.5 to 6.0 µm. The lower limit is preferably 0.6 µm or more, more preferably 0.65 µm or more, and still more preferably 0.7 µm or more. The upper limit is preferably 4.4 µm or less, more preferably 4.0 µm or less, and still more preferably 2.8 µm or less.

Returning to FIG. 12, the pixels 21a, 21b, and 21c of the color separation layer are formed between the partition walls 2a, and on a light receiving surface 11a of the light detection layer 11, respectively. The pixels 21a, 21b, and 21c are different types of pixels. That is, in the structural body 107 of FIG. 12, pixels of the same type are formed over a plurality of adjacent light detection layers 11. The type and thickness of each pixel constituting the color separation layer are the same as those described in the first embodiment, and the preferred ranges thereof are also the same.

As shown in FIG. 12, in the structural body 107, the optical waveguide layer 30 is provided on a color separation layer 21. The optical waveguide layer 30 is the same as that described in the first embodiment, and the preferred range thereof is also the same.

In the structural body 107 shown in FIG. 12, the light detection layer 11 for 4 pixels is provided in a region for one section separated by the partition wall 2a on the support 1, but the number of light detection layers 11 included in the region for one section is not particularly limited, and may be 2 or 3, or 5 or more.

In addition, in the structural body 107 shown in FIG. 12, the partition wall 2a is provided between adjacent different types of pixels in the color separation layer 21, but the partition wall 2a may be not provided. In a case where the partition wall 2a is provided between adjacent different types of pixels in the color separation layer 21, it is possible to improve rectangularness of each pixel constituting the color separation layer 21, or to suppress variations in pixel size. In a case where the partition wall 2a is not provided, producing process of the structural body can be simplified.

In the structural body 107 shown in FIG. 12, the optical waveguide layer 30 is provided on the surface of the color separation layer 21, but a flattening layer may be provided between the color separation layer 21 and the optical waveguide layer 30. In addition, a flattening layer may be further provided on the surface of the optical waveguide layer 30 on the light incident side. In addition, a flattening layer may be provided between the color separation layer 21 and the optical waveguide layer 30, and on the surface of the optical waveguide layer 30 on the light incident side, respectively. It is preferable that the above-described flattening layer is provided on at least one surface of the optical waveguide layer 30 on the light transmitting side (lower side).

In addition, in the structural body 107 shown in FIG. 12, the optical waveguide layer 30 is provided on the color separation layer 21 only on the light incident side, but the optical waveguide layer 30 may also be provided on the color separation layer 21 on the light transmitting side.

In addition, in the structural body 107 shown in FIG. 12, the aspects described in the second to sixth embodiments can be further adopted.

In the first to seventh embodiments, the flattening layer may be provided on the upper part and the lower part of the color separation layer.

<Composition for Forming Colored Pixel>

Next, a composition for forming a colored pixel, which is preferably used for forming the color separation layer of the structural body according to the embodiment of the present invention, will be described.

<<Chromatic Colorant>>

The composition for forming a colored pixel preferably contains a chromatic colorant. Examples of the chromatic colorant include chromatic colorants such as a red colorant, a green colorant, a blue colorant, a yellow colorant, a violet colorant, and an orange colorant. The chromatic colorant may be a pigment or a dye. The pigment and the dye may be used in combination. In addition, the pigment may be either an inorganic pigment or an organic pigment. In addition, as the pigment, a material in which a part of an inorganic pigment or an organic-inorganic pigment is replaced with an organic chromophore can also be used. By substituting an inorganic pigment or an organic-inorganic pigment with an organic chromophore, color tone design can be easily performed.

Other chromatic colorants used in the present invention preferably include a pigment. The content of the pigment in the chromatic colorant is preferably 50% by mass or more, more preferably 70% by mass or more, still more preferably 80% by mass or more, and particularly preferably 90% by mass or more. Examples of the pigment include the following pigments:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 231, 232 (methine-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), and the like (all of which are red pigments);

C. I. Pigment Green 7, 10, 36, 37, 58, 59, 62, 63, and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A. In addition, as the green pigment, compounds described in CN2010-6909027A, phthalocyanine compounds described in WO2012/102395A, which have a phosphoric acid ester as a ligand, or the like can also be used.

In addition, an aluminum phthalocyanine compound having a phosphorus atom can also be used as the blue pigment. Specific examples thereof include the compounds described in paragraph Nos. 0022 to 0030 of JP2012-247591A and paragraph No. 0047 of JP2011-157478A.

In addition, as the yellow pigment, pigments described in JP2017-201003A, pigments described in JP2017-197719A, pigments described in paragraph Nos. 0011 to 0062 and 0137 to 0276 of JP2017-171912A, pigments described in paragraph Nos. 0010 to 0062 and 0138 to 0295 of JP2017-171913A, pigments described in paragraph Nos. of 0011 to 0062 and 0139 to 0190 of JP2017-171914A, and pigments described in paragraph Nos. 0010 to 0065 and 0142 to 0222 of JP2017-171915A can also be used.

In addition, as the yellow pigment, compounds described in JP2018-062644A can also be used. These compounds can also be used as a pigment derivative.

As the red pigment, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/0102399A, diketopyrrolopyrrole compounds described in WO2012/0117965A, naphtholazo compounds described in JP2012-229344, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

In the present invention, a dye can also be used as the chromatic colorant. The dye is not particularly limited and a known dye can be used. Examples thereof include a pyrazoleazo-based dye, an anilinoazo-based dye, a triarylmethane-based dye, an anthraquinone-based dye, an anthrapyridone-based dye, a benzylidene-based dye, an oxonol-based dye, a pyrazolotriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, and a pyrromethene-based dye. In addition, thiazole compounds described in JP2012-158649A, azo compounds described in JP2011-184493A, or azo compounds described in JP2011-145540A can also be preferably used. In addition, as yellow dyes, the quinophthalone compounds described in paragraph Nos. 0011 to 0034 of JP2013-054339A, or the quinophthalone compounds described in paragraph Nos. 0013 to 0058 of JP2014-026228A can be used.

In the present invention, a coloring agent multimer can also be used as the chromatic colorant. The coloring agent multimer is preferably a dye which is used after being dissolved in a solvent, or the coloring agent multimer may form a particle. In a case where the coloring agent multimer is the particle, it is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2000 to 50000. The lower limit is more preferably 3000 or more and still more preferably 6000 or more. The upper limit is more preferably 30000 or less and still more preferably 20000 or less. As the coloring agent multimer, the compounds described in JP2011-213925A, JP2013-041097A, JP2015-028144A, JP2015-030742A, WO2016/031442A, or the like can also be used.

In addition, as the chromatic colorant, condensed ring-type quinophthalone compounds described in WO2012/128233A and colorants described in WO2011/037195A can also be used.

The content of the chromatic colorant in the total solid content of the composition for forming a colored pixel is preferably 10% by mass or more, more preferably 15% by mass or more, still more preferably 20% by mass or more, and particularly preferably 40% by mass or more. The upper limit is preferably 80% by mass or less and more preferably 75% by mass or less.

<<Pigment Derivative>>

The composition for forming a colored pixel can contain a pigment derivative. Examples of the pigment derivative include a compound having a structure in which a part of a chromophore is substituted with an acid group, a basic group, or a phthalimidemethyl group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. As the acid group included in the pigment derivative, a sulfo group or a carboxyl group is preferable and a sulfo group is more preferable. As the basic group included in the pigment derivative, an amino group is preferable and a tertiary amino group is more preferable.

In the present invention, as the pigment derivative, a pigment derivative having excellent visible transparency (hereinafter, also referred to as a transparent pigment derivative) can be contained. The maximum value (εmax) of the molar light absorption coefficient of the transparent pigment derivative in a wavelength range of 400 to 700 nm is preferably 3000 L·mol$^{-1}$·cm$^{-1}$ or less, more preferably 1000 L·mol$^{-1}$·cm$^{-1}$ or less, and still more preferably 100 L·mol$^{-1}$·cm$^{-1}$ or less. The lower limit of εmax is, for example, 1 L·mol$^{-1}$·cm$^{-1}$ or more and may be 10 L·mol$^{-1}$·cm$^{-1}$ or more.

Specific examples of the pigment derivative include compounds described in paragraph Nos. 0162 to 0183 of JP2011-252065A, compounds described in JP2003-081972A, and compounds described in JP5299151B.

The content of the pigment derivative is preferably 1 to 30 parts by mass and still more preferably 3 to 20 parts by mass with respect to 100 parts by mass of the pigment. The pigment derivative may be used singly or in combination of two or more kinds thereof.

<<Radical Polymerizable Compound>>

The composition for forming a colored pixel preferably contains a radical polymerizable compound. The radical polymerizable compound is preferably, for example, a compound having an ethylenically unsaturated bond-containing group. Examples of the ethylenically unsaturated bond-containing group include a vinyl group, a (meth)allyl group, and a (meth)acryloyl group.

Any chemical forms of a monomer, a prepolymer, an oligomer, or the like may be used as the radical polymerizable compound, but a monomer is preferable. The molecular weight of the radical polymerizable compound is preferably 100 to 3000. The upper limit is more preferably 2000 or less and still more preferably 1500 or less. The lower limit is more preferably 150 or more and still more preferably 250 or more.

The radical polymerizable compound is preferably a compound including 3 or more ethylenically unsaturated bond-containing groups, more preferably a compound including 3 to 15 ethylenically unsaturated bond-containing groups, and still more preferably a compound having 3 to 6 ethylenically unsaturated bond-containing groups. In addition, the radical polymerizable compound is preferably a trifunctional to pentadecafunctional (meth)acrylate compound and more preferably a trifunctional to hexafunctional (meth)acrylate compound.

Specific examples of the radical polymerizable compound include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference. As the radical polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable.

The content of the radical polymerizable compound in the total solid content of the composition for forming a colored pixel is preferably 0.1% to 50% by mass. The lower limit is more preferably 0.5% by mass or more and still more preferably 1% by mass or more. The upper limit is more preferably 45% by mass or less and still more preferably 40% by mass or less. The radical polymerizable compound may be used singly or in combination of two or more kinds thereof.

<<Photoradical Polymerization Initiator>>

The composition for forming a colored pixel preferably contains a photoradical polymerization initiator. The photoradical polymerization initiator is not particularly limited and can be appropriately selected from a known photoradical polymerization initiator. For example, a compound having photosensitivity to light ray in a range from an ultraviolet range to a visible range is preferable.

Examples of the photoradical polymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of exposure sensitivity, as the photoradical polymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable.

Examples of the photoradical polymerization initiator include compounds described in paragraphs 0065 to 0111 of JP2014-130173A, and JP6301489B, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraph Nos. 0025 to 0038 of WO2017/164127A. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Examples of a commercially available product of the oxime compound include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no coloring property or a compound having high transparency and being resistant to discoloration. Examples of a commercially available product thereof include ADEKA ARKLS NCI-730, NCI-831, and NCI-930 (all of which are manufactured by ADEKA Corporation).

The content of the photoradical polymerization initiator in the total solid content of the composition for forming a colored pixel is preferably 0.1% to 30% by mass. The lower limit is preferably 0.5% by mass or more and more preferably 1% by mass or more. The upper limit is preferably 20% by mass or less and more preferably 15% by mass or less. The photoradical polymerization initiator may be used singly or in combination of two or more kinds thereof.

<<Resin>>

The composition for forming a colored pixel preferably contains a resin. The resin is blended in, for example, an application for dispersing particles such as a pigment in a composition for forming a colored pixel or an application as a binder. Mainly, a resin which is used for dispersing particles such as a pigment is also referred to as a dispersant. However, such applications of the resin are only exemplary, and the resin can also be used for other purposes in addition to such applications.

The weight-average molecular weight (Mw) of the resin is preferably 3000 to 2000000. The upper limit is more preferably 1000000 or less and still more preferably 500000 or less. The lower limit is more preferably 4000 or more and still more preferably 5000 or more.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. In addition, resins described in paragraph Nos. 0041 to 0060 of JP2017-206689A, resins described in paragraph Nos. 0022 to 0071 of JP2018-010856A, resins described in JP2017-057265A, resins described in JP2017-032685A, resins described in JP2017-075248A, and resins described in JP2017-066240A can also be used.

In the present invention, as the resin, a resin having an acid group can be preferably used. According to this aspect, developability of the composition for forming a colored pixel can be further improved. Examples of the acid group include a carboxyl group, a phosphoric acid group, a sulfo group, and a phenolic hydroxy group, and a carboxyl group is preferable. The resin having an acid group can be used, for example, as an alkali-soluble resin.

The resin having an acid group preferably includes a repeating unit having an acid group in the side chain, and more preferably includes 5% to 70% by mole of repeating units having an acid group in the side chain with respect to the total repeating units of the resin. The upper limit of the content of the repeating unit having an acid group in the side chain is still more preferably 50% by mole or less and particularly preferably 30% by mole or less. The lower limit of the content of the repeating unit having an acid group in the side chain is still more preferably 10% by mole or more and particularly preferably 20% by mole or more.

As the resin having an acid group, for example, resins described in paragraph Nos. 0313 to 0317 of JP2013-029760A, which include a repeating unit described from an ether dimer, can also be used.

With regard to the resin having an acid group, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, the contents of which are incorporated herein by reference. A commercially available product can also be used as the resin having an acid group.

The acid value of the resin having an acid group is preferably 30 to 500 mgKOH/g. The lower limit is more preferably 50 mgKOH/g or more and still more preferably 70 mgKOH/g or more. The upper limit is more preferably 400 mgKOH/g or less, still more preferably 300 mgKOH/g or less, and particularly preferably 200 mgKOH/g or less. The weight-average molecular weight (Mw) of the resin having an acid group is preferably 5000 to 100000. In addition, the number-average molecular weight (Mn) of the resin having an acid group is preferably 1000 to 20000.

The composition for forming a colored pixel can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70% by mole or more in a case where the total amount of the acid group and the basic group is 100% by mole, and more preferably a resin substantially consisting of only an acid group. The acid group included in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50% by mole in a case where the total amount of the acid group and the basic group is 100% by mole. The basic group included in the basic dispersant is preferably an amino group.

The resin used as a dispersant preferably includes a repeating unit having an acid group. In a case where the resin used as a dispersant includes a repeating unit having an acid group, the generation of the development residue can be further suppressed in the formation of a pattern by a photolithography method.

It is also preferable that the resin used as a dispersant is a graft resin. Examples of the graft resin include resins described in paragraph Nos. 0025 to 0094 of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. Examples of the polyimine-based dispersant include resins described in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

In addition, the above-described resin (alkali-soluble resin) having an acid group can also be used as a dispersant.

In addition, it is also preferable that the resin used as a dispersant is a resin including a repeating unit having an ethylenically unsaturated bond-containing group in the side chain. The content of the repeating unit having an ethylenically unsaturated bond-containing group in the side chain is preferably 10% by mole or more, more preferably 10% to 80% by mole, and still more preferably 20% to 70% by mole with respect to the total repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. The dispersing agents described in paragraph Nos. 0041 to 0130 of JP2014-130338A can also be used, the contents of which are incorporated herein by reference. The resin described as a dispersant can be used for an application other than the dispersant. For example, the resin can also be used as a binder.

In a case where the composition for forming a colored pixel contains a resin, the content of the resin in the total solid content of the composition for forming a colored pixel is preferably 5% to 50% by mass. The lower limit is more preferably 10% by mass or more and still more preferably 15% by mass or more. The upper limit is more preferably 40% by mass or less, still more preferably 35% by mass or less, and particularly preferably 30% by mass or less. In addition, the content of the resin having an acid group, in the total solid content of the composition for forming a colored pixel, is preferably 5% to 50% by mass. The lower limit is more preferably 10% by mass or more and still more preferably 15% by mass or more. The upper limit is more preferably 40% by mass or less, still more preferably 35% by mass or less, and particularly preferably 30% by mass or less. In addition, from the reason that excellent developability is easily obtained, the content of the resin having an acid group in the total amount of the resin is preferably 30% by mass or more, more preferably 50% by mass or more, still more preferably 70% by mass or more, and particularly preferably 80% by mass or more. The upper limit may be 100% by mass, 95% by mass, or 90% by mass or less.

In addition, the total content of the radical polymerizable compound and the resin in the total solid content of the composition for forming a colored pixel is preferably 10% to 65% by mass. The lower limit is more preferably 15% by mass or more, still more preferably 20% by mass or more, and particularly preferably 30% by mass or more. The upper limit is more preferably 60% by mass or less, still more preferably 50% by mass or less, and particularly preferably 40% by mass or less. In addition, the photosensitive composition preferably contains 30 to 300 parts by mass of the resin with respect to 100 parts by mass of the polymerizable compound. The lower limit is more preferably 50 parts by mass or more and still more preferably 80 parts by mass or more. The upper limit is more preferably 250 parts by mass or less and still more preferably 200 parts by mass or less.

<<<Compound Having Cyclic Ether Group>>>

The composition for forming a colored pixel can contain a compound having a cyclic ether group. Examples of the cyclic ether group include an epoxy group and an oxetanyl group. The compound having a cyclic ether group is preferably a compound having an epoxy group. Examples of the compound having an epoxy group include a compound having one or more epoxy groups in one molecule, and a compound having two or more epoxy groups in one molecule is preferable. It is preferable to have 1 to 100 epoxy groups in one molecule. The upper limit of the number of epoxy groups may be, for example, 10 or less or 5 or less. The lower limit of the epoxy group is more preferably 2 or more. As the compound having an epoxy group, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents thereof are incorporated herein by reference.

The compound having an epoxy group may be either a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the compound having an epoxy group is preferably 200 to 100000 and more preferably 500 to 50000. The upper limit of the weight-average molecular weight is still more preferably 10000 or less, particularly preferably 5000 or less, and even more preferably 3000 or less.

Examples of a commercially available product of the compound having a cyclic ether group include EHPE 3150 (manufactured by DAICEL-ALLNEX LTD.), EPICLON N-695 (manufactured by DIC Corporation), and MARPROOF G-0150M, G-0105SA, G-0130SP, G-0250SP, G-1005S, G-1005SA, G-110S, G-2050M, G-01100, and G-01758 (all of which are manufactured by NOF Corporation, an epoxy group-containing polymer).

In a case where the composition for forming a colored pixel contains a compound having a cyclic ether group, the content of the compound having a cyclic ether group in the total solid content of the composition for forming a colored pixel is preferably 0.1% to 20% by mass. The lower limit is, for example, more preferably 0.5% by mass or more and still more preferably 1% by mass or more. The upper limit is, for example, more preferably 15% by mass or less and still more preferably 10% by mass or less. The compound having a cyclic ether group may be used singly or in combination of two or more kinds thereof.

<<Silane Coupling Agent>>

The composition for forming a colored pixel can contain a silane coupling agent. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the composition for forming a colored pixel is preferably 0.1% to 5% by mass. The upper limit is preferably 3% by mass or less and more preferably 2% by mass or less. The lower limit is preferably 0.5% by mass or more and more preferably 1% by mass or more. The silane coupling agent may be used singly or in combination of two or more kinds thereof.

<<Surfactant>>

The composition for forming a colored pixel can contain a surfactant. As the surfactant, various surfactants such as a fluorine-based surfactant, a nonionic surfactant, a cationic surfactant, an anionic surfactant, and a silicon-based surfactant can be used. Examples of the surfactant include surfactants described in paragraph Nos. 0238 to 0245 of WO2015/166779A, the contents of which are incorporated herein by reference.

It is preferable that the surfactant is a fluorine-based surfactant. By containing a fluorine-based surfactant in the composition for forming a colored pixel, liquid characteristics (particularly, fluidity) are further improved, and liquid saving properties can be further improved. In addition, it is possible to form a film with a small thickness unevenness.

Examples of the fluorine-based surfactant include surfactants described in paragraph Nos. 0060 to 0064 of JP2014-041318A (paragraph Nos. 0060 to 0064 of the corresponding WO2014/017669A) and the like, and surfactants described in paragraph Nos. 0117 to 0132 of JP2011-132503A, the contents of which are incorporated herein by reference. In addition, fluorine-containing surfactants described in paragraph Nos. 0016 to 0037 of JP2010-032698A, or the following compounds are also exemplified as the fluorine-based surfactant used in the present invention.

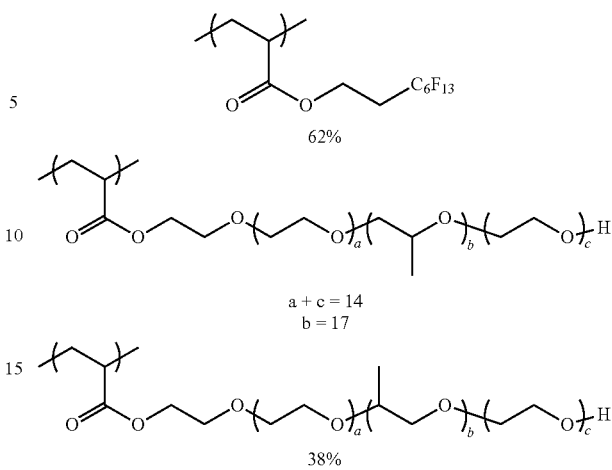

The weight-average molecular weight of the above-described compound is preferably 3000 to 50000, and is, for example, 14000. In the compound, "%" representing the proportion of a repeating unit is % by mole.

The content of the surfactant in the total solid content of the composition for forming a colored pixel is preferably 0.001% by mass to 5.0% by mass and more preferably 0.005% to 3.0% by mass. The surfactant may be used singly or in combination of two or more kinds thereof.

<<Ultraviolet Absorber>>

The composition for forming a colored pixel can contain a ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. Examples of such a compound include compounds described in paragraph Nos. 0038 to 0052 of JP2009-217221A, paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used.

The content of the ultraviolet absorber in the total solid content of the composition for forming a colored pixel is preferably 0.01% to 10% by mass and more preferably 0.01% to 5% by mass. In the present invention, the ultraviolet absorber may be used singly or in combination of two or more kinds thereof.

<<Organic Solvent>>

The composition for forming a colored pixel preferably contains an organic solvent. Basically, the organic solvent is not particularly limited as long as it satisfies the solubility of the respective components and the application properties of the composition for forming a colored pixel. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to solvents described in paragraph No. 0223 of WO2015/166779A, the contents of which are incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

The content of the organic solvent in the composition for forming a colored pixel is preferably 10% to 95% by mass, more preferably 20% to 90% by mass, and still more preferably 30% to 90% by mass.

<<Other Components>>

Optionally, the composition for forming a colored pixel may further contain a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the composition for forming a colored pixel may contain a potential antioxidant. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or basic catalyst so that the compound functions as an antioxidant. Examples of the potential antioxidant include the compounds described in WO2014/021023A, WO2017/030005A, and JP2017-008219A. Examples of a commercially available product of the potential antioxidant include ADEKA ARKLS GPA-5001 (manufactured by ADEKA Corporation).

<Composition for Forming White Pixel>

Next, a composition for forming a white pixel, which is preferably used for forming the color separation layer of the structural body according to the embodiment of the present invention, will be described. The composition for forming a white pixel preferably contains a white pigment. In the present invention, the white pigment includes not only a pure white pigment but also a bright gray (for example, grayish-white, light gray, and the like) pigment close to white. Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, as the white pigment, the titanium oxide described in "Titanium Oxide-Physical Properties and Applied Technology, written by Manabu Kiyono, pages 13 to 45, published in Jun. 25, 1991, published by Shuppan Co., Ltd." can also be used. The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle consisting of a core particle formed of polymer particles and a shell layer formed of inorganic fine nanoparticles. With regard to the core-shell composite particle consisting of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference. As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

The content of the white pigment in the total solid content of the composition for forming a white pixel is preferably 10% by mass or more, more preferably 15% by mass or more, still more preferably 20% by mass or more, and particularly preferably 30% by mass or more. The upper limit is preferably 80 mass % or less, more preferably 70 mass % or less, still more preferably 65 mass % or less, and particularly preferably 60 mass % or less.

The composition for forming a white pixel can further contain a radical polymerizable compound, a photoradical polymerization initiator, a resin, a compound having a cyclic ether group, a silane coupling agent, a surfactant, a ultraviolet absorber, an organic solvent, or the like. The preferred range of these materials and contents is the same as the materials and contents described in the above-described composition for forming a colored pixel.

<Composition for Forming Pixel of Near-Infrared Cut Filter>

Next, a composition for forming a pixel of near-infrared cut filter, which is preferably used for forming the color separation layer of the structural body according to the embodiment of the present invention, will be described. The composition for forming a pixel of near-infrared cut filter preferably contains a near-infrared absorber. The near-infrared absorber is preferably a compound having a maximum absorption wavelength on a wavelength side longer than a wavelength of 700 nm. The near-infrared absorber is preferably a compound having a maximum absorption wavelength in a wavelength range of more than 700 nm and 1800 nm or less. In addition, in the near-infrared absorber, a ratio $A^1/A^2$, which is a ratio of an absorbance $A^1$ at a wavelength of 500 nm to an absorbance $A^2$ at the maximum absorption wavelength, is preferably 0.08 or less and more preferably 0.04 or less.

Examples of the near-infrared absorber include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph No. 0080 of JP2016-006476A, the content of which is incorporated herein by reference. Examples of the metal boride include lanthanum boride. Examples of a commercially available product of lanthanum boride include $LaB_6$—F (manufactured by JAPAN NEW METALS CO., LTD.). In addition, as the metal boride, compounds described in WO2017/119394A can also be used. Examples of a commercially available product of indium tin oxide include F-ITO (manufactured by DOWA HIGHTECH CO., LTD.).

In addition, as the near-infrared absorber, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the α-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, and the like can also be used.

The content of the near-infrared absorber in the total solid content of the composition for forming a pixel of near-infrared cut filter is preferably 50% by mass or less, more preferably 40% by mass or less, and still more preferably 30% by mass or less. The lower limit is preferably 1% by mass or more, more preferably 3% by mass or more, and still more preferably 5% by mass or more.

The composition for forming a pixel of near-infrared cut filter can further contain a radical polymerizable compound, a photoradical polymerization initiator, a resin, a compound having a cyclic ether group, a silane coupling agent, a surfactant, a ultraviolet absorber, an organic solvent, or the like. The preferred range of these materials and contents is the same as the materials and contents described in the above-described composition for forming a colored pixel.

<Composition for Forming Pixel of Near-Infrared Transmission Filter>

Next, a composition for forming a pixel of near-infrared transmission filter, which is preferably used for forming the color separation layer of the structural body according to the embodiment of the present invention, will be described. The composition for forming a pixel of near-infrared transmission filter can also contain a coloring material which allows transmission of near-infrared light and shields visible light (hereinafter, also referred to as a "coloring material which shields visible light"). In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm. In the present invention, it is preferable that the coloring material which shields visible light satisfies at least one of the following requirement (A) or (B).

(A): coloring material which shields visible light includes two or more chromatic colorants, and a combination of the two or more chromatic colorants forms black.

(B): coloring material which shields visible light includes an organic black colorant.

Examples of the chromatic colorant include the above-described chromatic colorants. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include the compounds described in JP2010-534726A, JP2012-515233A, JP2012-515234A, and the like, and the bisbenzofuranone compound is available, for example, as "Irgaphor Black" manufactured by BASF. Examples of the perylene compound include compounds described in paragraph Nos. 0016 to 0020 of JP2017-226821A, and C. I. Pigment Black 31 and 32. Examples of the azomethine compound include the compounds described in JP1989-170601A (JP-H01-170601A) and JP1990-034664A (JP-H02-034664A), and the azomethine compound is available, for example, "CHROMOFINE BLACK A1103" manufactured by Dainichiseika Color & Chemicals Mfg. Co., Ltd.

In a case where a combination of two or more chromatic colorants forms black, examples of the combination of the chromatic colorants include the following.

(1) aspect in which the coloring material which shields visible light contains a yellow colorant, a blue colorant, a violet colorant, and a red colorant
(2) aspect in which the coloring material which shields visible light contains a yellow colorant, a blue colorant, and a red colorant
(3) aspect in which the coloring material which shields visible light contains a yellow colorant, a violet colorant, and a red colorant
(4) aspect in which the coloring material which shields visible light contains a yellow colorant and a violet colorant
(5) aspect in which the coloring material which shields visible light contains a green colorant, a blue colorant, a violet colorant, and a red colorant
(6) aspect in which the coloring material which shields visible light contains a violet colorant and an orange colorant
(7) aspect in which the coloring material which shields visible light contains a green colorant, a violet colorant, and a red colorant
(8) aspect in which the coloring material which shields visible light contains a green colorant and a red colorant The content of the coloring material which shields visible light in the total solid content of the composition for forming a pixel of near-infrared transmission filter is preferably 60% by mass or less, more preferably 50% by mass or less, still more preferably 30% by mass or less, even more preferably 20% by mass or less, and particularly preferably 15% by mass or less. The lower limit may be, for example, 0.01 mass % or more or 0.5 mass % or more.

The composition for forming a pixel of near-infrared transmission filter can further contain a near-infrared absorber. The preferred range of these materials and contents is the same as the materials and contents described in the above-described composition for forming a pixel of near-infrared transmission filter.

The composition for forming a pixel of near-infrared transmission filter can further contain a radical polymerizable compound, a photoradical polymerization initiator, a resin, a compound having a cyclic ether group, a silane coupling agent, a surfactant, a ultraviolet absorber, an organic solvent, or the like. The preferred range of these materials and contents is the same as the materials and contents described in the above-described composition for forming a colored pixel.

<Solid-State Imaging Element>

The solid-state imaging element according to an embodiment of the present invention includes the structural body according to the embodiment of the present invention. The configuration of the solid-state imaging element is not particularly limited as long as it functions as a solid-state imaging element.

<Image Display Device>

The image display device according to an embodiment of the present invention includes the structural body according to the embodiment of the present invention. Examples of the image display device include a liquid crystal display device or an organic electroluminescence display device. The definitions of image display devices or the details of the respective image display devices are described in, for example, "Electronic Display Device (written by Akio Sasaki, Kogyo Chosakai Publishing Co., Ltd., published in 1990)", "Display Device (written by Sumiaki Ibuki, Sangyo Tosho Co., Ltd., published in 1989)", and the like. In addition, the details of a liquid crystal display device can be found in, for example, "Next-Generation Liquid Crystal Display Techniques (edited by Tatsuo Uchida, Kogyo Chosakai Publishing Co., Ltd., published in 1994)". The liquid crystal display device to which the present invention is applicable is not particularly limited. For example, the present invention is applicable to various liquid crystal display devices described in "Next-Generation Liquid Crystal Display Techniques".

EXAMPLES

Hereinafter, the present invention will be described in more detail with reference to the examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. A weight-average molecular weight and a number-average molecular weight are values in terms of polystyrene through measurement by the GPC method as described above.

<Production of Support Having Partition Wall>

As a support, a silicon wafer having a diameter of 8 inches (20.32 cm) on which a silicon photodiode had been formed was used. A surface of the silicon wafer on the side where the silicon photodiode had been formed was spin-coated with a composition for forming a partition wall described later, heated at 100° C. for 2 minutes using a hot plate, further heated at 230° C. for 2 minutes using a hot plate, thereby forming a partition wall material layer having a film thickness of 0.5 µm. The above-described partition wall material layer was further spin-coated with a composition for anti-reflection film (manufactured by Brewer Science, Inc., DUV42P) such that a film thickness after baking was 64 nm, heated at 200° C. for 1 minute, and cooled to 23° C., thereby forming an anti-reflection film. Next, the laminate was spin-coated with a positive type photoresist (FFPS-0283, manufactured by FUJIFILM Electronic Materials Co., Ltd.), and heated at 90° C. for 1 minute to form a photoresist layer having a thickness of 0.8 µm. Next, using a KrF scanner exposure machine (FPA6300ES6a, manufactured by Canon Inc.), the laminate was exposed with an exposure energy of 16 J/cm$^2$ through a mask, and heated at 100° C. for 1 minute. Thereafter, after developing for 1 minute with a developer (FHD-5, manufactured by FUJIFILM Electronic Materials Co., Ltd.), the laminate was heated at 100° C. for 1 minute to form a mesh-like pattern having a line width of 0.12 µm and a pitch width of 1 µm. Using this pattern as a photo mask, the laminate was patterned by a dry etching method under the conditions described in paragraph Nos. 0129 to 0130 of JP2016-014856A, thereby forming partition walls having a width of 0.12 µm and a height of 0.5 µm in a lattice form at intervals of 1 µm. The size of the opening of the partition wall on the silicon wafer (area for one pixel partitioned by the partition wall on the silicon wafer) was 0.88 µm in length and 0.88 µm in width. Combined with the width of 0.12 µm of the partition wall, this example is defined as a 1.0 µm pixel size.

[Composition for Forming Partition Wall]

The composition for forming a partition wall was prepared by the following method.

First, tetraethoxysilane (TEOS) was prepared as a silicon alkoxide (A), and trifluoropropyltrimethoxysilane (TFPTMS) was prepared as a fluoroalkyl group-containing silicon alkoxide (B). These compounds were weighed such that, in a case where the mass of the silicon alkoxide (A) was 1, the proportion (mass ratio) of the fluoroalkyl group-containing silicon alkoxide (B) was 0.6, and were put into a separable flask and mixed to obtain a mixture. Propylene glycol monomethyl ether (PGME) was added to the mixture in an amount of 1.0 part by mass with respect to 1.0 part by mass of the mixture, and the mixture was stirred at 30° C. for 15 minutes to prepare a first solution. In addition to this first solution, 1.0 part by mass of ion exchange water and 0.01 parts by mass of formic acid were added to the mixture with respect to 1.0 part by mass of the above-described mixture, and the mixture was mixed and stirred at 30° C. for 15 minutes to prepare a second solution. Next, the prepared first solution was held at a temperature of 55° C. in a water bath, the second solution was added to this first solution, and the mixture was stirred for 60 minutes while maintaining the temperature. As a result, a solution F including a hydrolyzate of the above-described silicon alkoxide (A) and the above-described fluoroalkyl group-containing silicon alkoxide (B) was obtained. The concentration of solid contents of the solution F was 10% by mass in terms of $SiO_2$. Next, 0.1 parts by mass of an aqueous solution of calcium nitrate, having a concentration of 30% by mass, was added to 100 parts by mass of a commercially available aqueous dispersion liquid including 30% by mass of colloidal silica (manufactured by Nissan Chemical Corporation, trade name: ST-30) having an average diameter of 15 nm, and the mixed solution was heated at 120° C. for 5 hours in a stainless steel autoclave. The solvent in the mixed solution was replaced with propylene glycol monomethyl ether by using an ultrafiltration method, and the mixed solution was further stirred with a homomixer (manufactured by PRIMIX Corporation) at a rotation speed of 14000 rpm for 30 minutes, and propylene glycol monomethyl ether was further added thereto to obtain a colloidal silica particle solution G having a concentration of solid contents of 15% by mass. 30 parts by mass of the above-described solution F and 70 parts by mass of the above-described colloidal silica particle solution G were mixed, and the mixture was further heated at 40° C. for 10 hours and centrifuged at 1000G for 10 minutes to remove sediment. As a result, a colloidal silica particle solution P1 having an average particle size of spherical silica (circle-equivalent diameter in a projected image of the spherical part measured by a transmission electron microscope (TEM)) of 15 nm and an average particle size of colloidal silica particles measured by a dynamic light scattering method of 80 nm was obtained.

Next, using the colloidal silica particle solution obtained above, each component was mixed so as to have the composition shown in the table below, thereby obtaining the composition for forming a partition wall. After the preparation of the above-described colloidal silica particle solution and after the preparation of the composition for forming a partition wall, filtration was performed using DFA4201NIEY (0.45 µm nylon filter) manufactured by Pall Corporation.

TABLE 1

| | | Colloidal silica particle solution | Surfactant | Solvent | | | |
|---|---|---|---|---|---|---|---|
| | | | | PGME | PGMEA | LC-OH | W |
| Composition for forming partition wall | Type Blending amount | P1 10 | F1 0.02 | 50 | 35 | 4 | 1 |

The numerical values of the blending amount shown in the above table indicate parts by mass. In addition, the blending amount of the colloidal silica particle solution is the amount of $SiO_2$ in the particle solution. The numerical value of the blending amount of the solvent is a numerical value which is the total amount of solvents included in the colloidal silica particle solution. The raw materials described in the above table are as follows.

(Colloidal Silica Particle Solution)

P1: Colloidal silica particle solution P1 described above (Surfactant)

F1: compound having the following structure (Mw=14000; "%" representing the proportion of a repeating unit is % by mole)

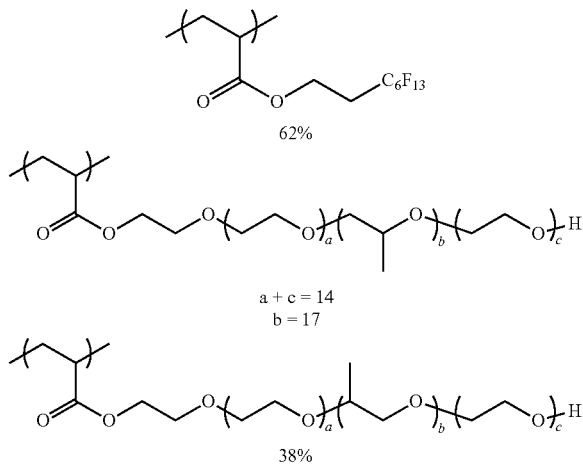

(Solvent)

PGME: propylene glycol monomethyl ether

PGMEA: propylene glycol monomethyl ether acetate

LC-OH: ethanol, methanol, or a mixture thereof

W: water

<Preparation of Composition for Forming Flattening Layer>

Next, each component was mixed so as to have the composition shown in the table below, thereby obtaining a composition for forming a flattening layer.

TABLE 2

| | | Colloidal silica particle solution | Surfactant | Solvent | | | |
|---|---|---|---|---|---|---|---|
| | | | | PGME | PGMEA | LC-OH | W |
| Composition for forming flattening layer | Type Blending amount | P1 5 | F1 0.02 | 55 | 35 | 4 | 1 |

The numerical values of the blending amount shown in the above table indicate parts by mass. In addition, the blending amount of the colloidal silica particle solution is the amount of $SiO_2$ in the particle solution. The numerical value of the blending amount of the solvent is a numerical value which is the total amount of solvents included in the colloidal silica particle solution. The raw materials described in the above table are the same as the raw materials used in the composition for forming a partition wall.

<Preparation of Composition for Forming Colored Pixel>

(Composition for Forming Green Pixel)

The following raw materials were mixed and dispersed for 3 hours using a beads mill (zirconia beads having a diameter of 0.1 mm). Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersion treatment was repeated up to 10 times, thereby obtaining a pigment dispersion liquid G1.

PG58 . . . 8.5 parts by mass
PY185 . . . 2.9 parts by mass
Pigment derivative 1 . . . 1.6 parts by mass
Dispersant 1 . . . 4.7 parts by mass
Propylene glycol monomethyl ether acetate (PGMEA) . . . 82.3 parts by mass Subsequently, after stirring a mixed solution obtained by mixing the following raw materials, the obtained mixed solution was filtered through a nylon filter (manufactured by Pall Corporation) having a pore size of 0.45 μm to obtain a composition for forming a green pixel.

Pigment dispersion liquid G1 . . . 69.0 parts by mass
40% by mass PGMEA solution of resin 1 . . . 1.2 parts by mass
Polymerizable monomer 1 . . . 1.1 parts by mass
Photopolymerization initiator 1 . . . 0.5 parts by mass
1% by mass PGMEA solution of surfactant 1 . . . 4.2 parts by mass
Ultraviolet absorber 1 . . . 0.5 parts by mass
Compound 1 having epoxy group . . . 0.2 parts by mass
PGMEA . . . 23.3 parts by mass (Composition for Forming Red Pixel)

The following raw materials were mixed and dispersed for 3 hours using a beads mill (zirconia beads having a diameter of 0.1 mm). Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersion treatment was repeated up to 10 times, thereby obtaining a pigment dispersion liquid R1.

PR254 . . . 10.5 parts by mass
PY139 . . . 0.9 parts by mass
Pigment derivative 1 . . . 1.6 parts by mass
Dispersant 1 . . . 4.7 parts by mass
PGMEA . . . 82.3 parts by mass Subsequently, after stirring a mixed solution obtained by mixing the following raw materials, the obtained mixed solution was filtered through a nylon filter (manufactured by Pall Corporation) having a pore size of 0.45 μm to obtain a composition for forming a red pixel.

Raw Materials of Composition:
Pigment dispersion liquid R1 . . . 58.9 parts by mass
40% by mass PGMEA solution of resin 1 . . . 2.0 parts by mass
Polymerizable monomer 1 . . . 0.9 parts by mass
Photopolymerization initiator 1 . . . 0.5 parts by mass
1% by mass PGMEA solution of surfactant 1 . . . 4.2 parts by mass
Ultraviolet absorber 1 . . . 0.1 parts by mass
Compound 1 having epoxy group . . . 0.1 parts by mass
PGMEA . . . 33.3 parts by mass (Composition for Forming Blue Pixel)

The following raw materials were mixed and dispersed for 3 hours using a beads mill (zirconia beads having a diameter of 0.1 mm). Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersion treatment was repeated up to 10 times, thereby obtaining a pigment dispersion liquid B1.

PB15:6 . . . 9.6 parts by mass
PV23 . . . 2.4 parts by mass
Pigment derivative 1 . . . 1.0 part by mass
Dispersant 1 . . . 4.7 parts by mass
PGMEA . . . 82.3 parts by mass Subsequently, after stirring a mixed solution obtained by mixing the following raw materials, the obtained mixed solution was filtered through a nylon filter (manufactured by Pall Corporation) having a pore size of 0.45 μm to obtain a composition for forming a blue pixel.

Pigment dispersion liquid B1 . . . 54.1 parts by mass
40% by mass PGMEA solution of resin 1 . . . 1.0 parts by mass
Polymerizable monomer 1 . . . 0.9 parts by mass
Photopolymerization initiator 1 . . . 0.6 parts by mass
1% by mass PGMEA solution of surfactant 1 . . . 4.2 parts by mass
Ultraviolet absorber 1 . . . 0.1 parts by mass
Compound 1 having epoxy group . . . 0.1 parts by mass
PGMEA . . . 39.0 parts by mass The details of the raw materials shown by abbreviations used in the composition for forming a colored pixel are as follows.

PG58: C. I. Pigment Green 58
PY185: C. I Pigment Yellow 185
PR254: C. I Pigment Red 254
PY139: C. I Pigment Yellow 139
PB15:6: C. I Pigment Blue 15:6
PV23: C. I. Pigment Violet 23
Pigment derivative 1: compound having the following structure

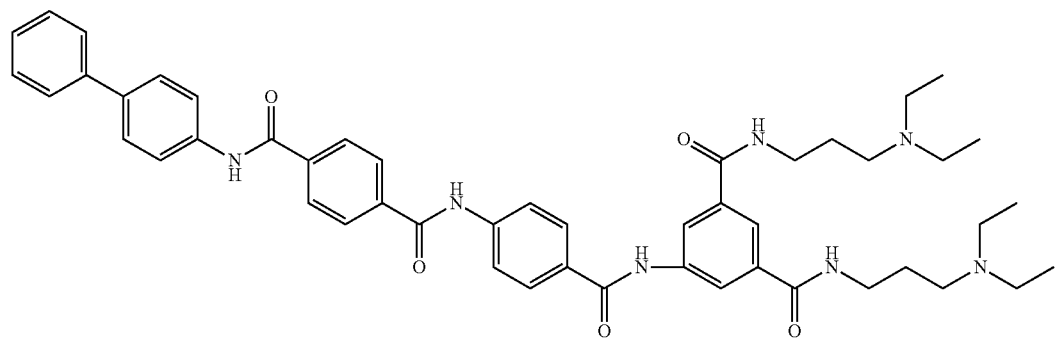 [SMILES: CCN(CC)CCCNC(=O)c1cc(NC(=O)c2ccc(NC(=O)c3ccc(C(=O)Nc4ccc(-c5ccccc5)cc4)cc3)cc2)cc(C(=O)NCCCN(CC)CC)c1]

Dispersant 1: resin having the following structure. The numerical value described together with the main chain indicates a molar ratio of a repeating unit, and the numerical value described together with the side chain indicates the number of repeating units. Mw=20000.

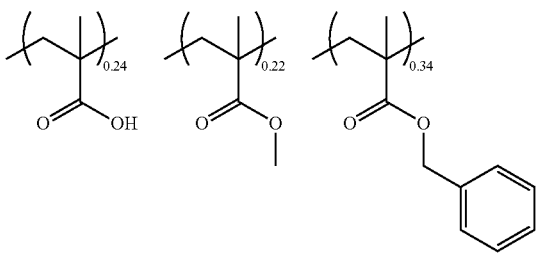

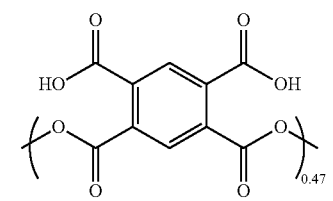

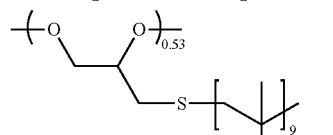

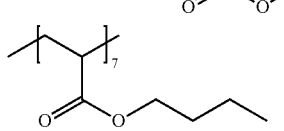

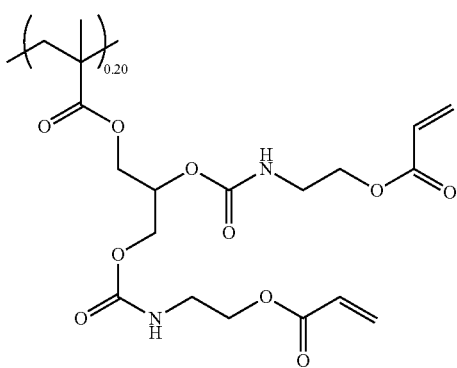

Resin 1: resin having the following structure. The numerical value described together with the main chain indicates a molar ratio of a repeating unit. Mw=60000.

Polymerizable monomer 1: compound having the following structure

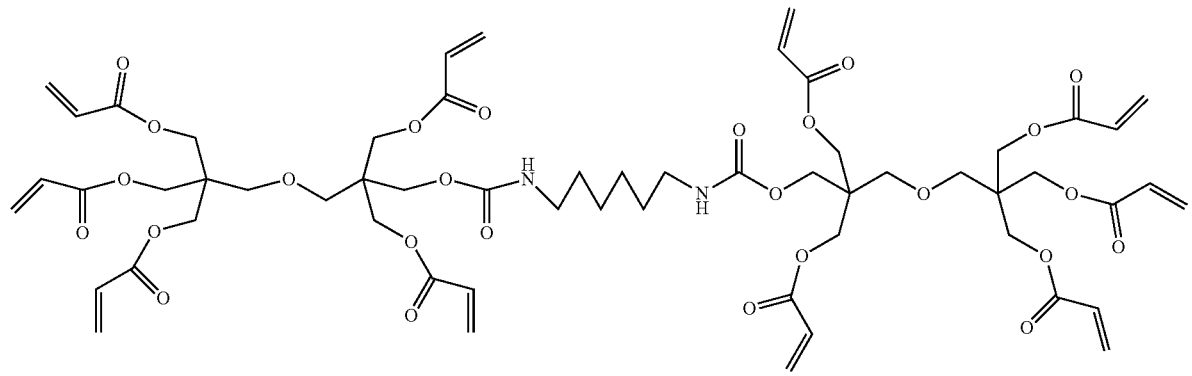 [SMILES: C=CC(=O)OCC(COCC(COC(=O)C=C)(COC(=O)C=C)COC(=O)NCCCCCCNC(=O)OCC(COCC(COC(=O)C=C)(COC(=O)C=C)COC(=O)C=C)(COC(=O)C=C)COC(=O)C=C)(COC(=O)C=C)COC(=O)C=C]

Photopolymerization initiator 1: compound having the following structure

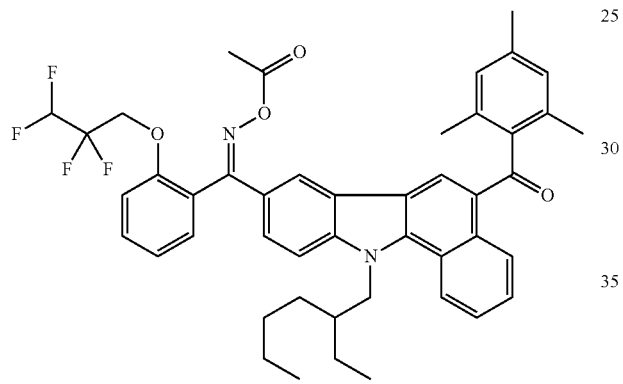

Surfactant 1: compound having the following structure (Mw=14000; "%" representing the proportion of a repeating unit is % by mole)

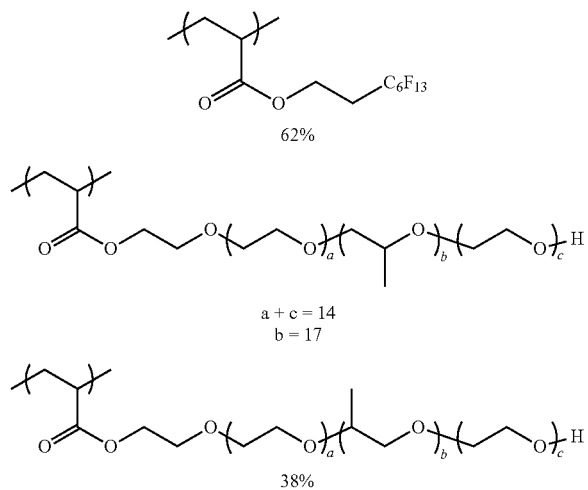

Ultraviolet absorber 1: compound having the following structure

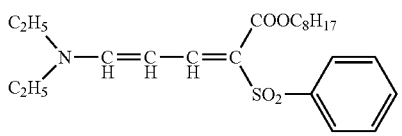

Compound 1 having epoxy group: EHPE 3150 (manufactured by DAICEL-ALLNEX LTD.; 1,2-epoxy-4-(2-oxiranyl)cyclohexane adduct of 2,2'-bis(hydroxymethyl)-1-butanol)

<Production of Structural Body>

Example 1

The composition for forming a green pixel was applied to the support having partition walls prepared as described above by a spin coating method, and heated at 100° C. for 2 minutes using a hot plate, thereby forming a green composition layer having a thickness of 0.6 m. Next, using an i-ray stepper exposure device FPA-3000 i5+(manufactured by Canon Corporation), the above-described green composition layer was exposed at an exposure dose of 150 mJ/cm$^2$ through a mask in which 1.0 μm square openings (1.0 μm pixels, partition wall width between pixels: 0.12 μm, partition wall inner diameter: 0.88 μm) are Bayer-arranged. Next, puddle development was performed to the green composition layer at 23° C. for 60 seconds using a tetramethylammonium hydroxide (TMAH) 0.3% by mass aqueous solution. Thereafter, rinsing with a spin shower and washing with pure water were performed thereto, and the green composition layer was further heated at 200° C. for 5 minutes using a hot plate, thereby forming green pixels having a thickness of 0.5 μm and 1.0 μm square (1.0 μm pixels, partition wall width between pixels: 0.12 μm, partition wall inner diameter: 0.88 μm) in a region surrounded by the partition walls on the support. The same operation was performed for the composition for forming a red pixel and the composition for forming a blue pixel, and a red pixel and a blue pixel were respectively formed in an area in which the pattern of the green pixel was removed, thereby a color separation layer consisting of the green pixel, the red pixel, and the blue pixel.

Next, the surface of the color separation layer was spin-coated with the composition for forming a flattening layer, and heated at 100° C. for 2 minutes and 200° C. for 5 minutes using a hot plate, thereby forming a flattening layer having a film thickness of 0.1 μm.

Next, using a magnetron sputtering device, $SiO_2$ was sputtered on the surface of the flattening layer to form an optical waveguide layer having a thickness of 0.9 μm, thereby producing a structural body. This optical waveguide layer was a layer in which a plurality of columnar structural bodies of $SiO_2$ were arranged at an angle of 0° to 0.5° with respect to a normal line of a light receiving surface of the support. In addition, the average diameter of the columnar structural bodies was 50 nm, and the gap between the columnar structural bodies was 1 nm.

This structural body was excellent in light condensing property in the light detection layer (silicon photodiode). By incorporating this structural body into a solid-state imaging element or an image display device, excellent light-receiving sensitivity was obtained.

Example 2

In the same manner as in Example 1, a color separation layer was formed on the support having partition walls prepared as described above.

Next, the surface of the color separation layer was spin-coated with the composition for forming a flattening layer, and heated at 100° C. for 2 minutes and 200° C. for 5 minutes using a hot plate, thereby forming a flattening layer having a film thickness of 0.1 μm. Next, using a magnetron sputtering device, $SiO_2$ was sputtered on the surface of the flattening layer to form an optical waveguide layer having a thickness of 0.9 μm. This optical waveguide layer was a layer in which a plurality of columnar structural bodies of $SiO_2$ were arranged at an angle of 0° to 0.5° with respect to a normal line of a light receiving surface of the support. In addition, the average diameter of the columnar structural bodies was 50 nm, and the gap between the columnar structural bodies was 1 nm or less.

Next, the optical waveguide layer was spin-coated with a positive type photoresist (FFPS-0283, manufactured by FUJIFILM Electronic Materials Co., Ltd.), and heated at 90° C. for 1 minute to form a photoresist layer having a thickness of 0.8 μm. Next, using a KrF scanner exposure machine (FPA6300ES6a, manufactured by Canon Inc.), the optical waveguide layer was exposed with an exposure energy of 17 mJ/cm$^2$ through a mask, and heated at 90° C. for 1 minute. As the mask, a 3D grayscale mask having a cell size of 1.0 μm and having a gradient after development was used.

Next, puddle development was performed to the optical waveguide layer for 30 seconds using a developer (FHD-5, manufactured by FUJIFILM Electronic Materials Co., Ltd.). Thereafter, rinsing with a spin shower and washing with pure water were performed thereto, and the optical waveguide layer was further heated at 100° C. for 1 minute using a hot plate, thereby forming a stepped photo mask. This photo mask did not have a staircase in the center of the structure, and a stepped pattern was formed according to the distance from the center of the structural body. The film thickness of the photo mask was 0.2 μm at the central portion of the structural body, and was 0.8 μm at the outermost peripheral portion. In addition, the height difference of the inclined surface of the stepped pattern was 0.4 μm. Using this photo mask, dry etching was performed under the following conditions to form a stepwise inclined pattern on the surface of the optical waveguide layer, thereby producing a structural body shown in FIG. 9.

This structural body was excellent in light condensing property in the light detection layer (silicon photodiode). By incorporating this structural body into a solid-state imaging element or an image display device, a clearer image could be obtained.

(Dry Etching Conditions)
Equipment: Centura DPS manufactured by Applied Materials, Inc.
Gas used: $CHF_3/SF_6/Ar$=38/5/57 sccm
Temperature: 40° C.
Power (source/bias)=200/20 W
Pressure: 8.0 Pa
Time: 210 seconds

Example 3

In Example 2, the type of the mask used in a case of exposing the photoresist layer formed on the optical waveguide layer was changed to form a photo mask curved toward the central portion of the structural body. The film thickness of the photo mask was 0.2 μm at the central portion of the structural body, and was 0.8 μm at the outermost peripheral portion. Using this photo mask, dry etching was performed under the same conditions as in Example 2 to form a pattern inclined toward the center on the surface of the optical waveguide layer, thereby producing a structural body shown in FIG. 7. This structural body was excellent in light condensing property in the light detection layer (silicon photodiode). By incorporating this structural body into a solid-state imaging element or an image display device, a clearer image could be obtained.

Example 4

In the same manner as in Example 1, a color separation layer was formed on the support having partition walls prepared as described above.

Next, the surface of the color separation layer was spin-coated with the composition for forming a flattening layer, and heated at 100° C. for 2 minutes and 200° C. for 5 minutes using a hot plate, thereby forming a flattening layer having a film thickness of 0.1 μm.

Next, the flattening layer coated with a curable composition described in paragraph No. 0315 of JP2014-029524A, and heated at 100° C. for 2 minutes and 220° C. for 5 minutes using a hot plate, thereby forming a lens material layer having a thickness of 1.0 μm.

Next, this lens material layer was coated with GKR-5113 (trade name; manufactured by FUJIFILM Electronic Materials Co., Ltd.), and heated at 120° C. for 90 seconds using a hot plate to form a photosensitive photoresist layer. Thereafter, exposure and development were performed to the photosensitive photoresist layer, thereby forming a semicircular photoresist pattern having a height of 0.40 μm to 1.0 μm and a gap size of 0.2 to 0.3 μm between lens matrixes. Using this photoresist pattern as a mask, dry etching was performed under the following conditions to form a microlens (semicircular gapless microlens) to which the shape of the mask was transferred directly above the pixels of each color in the color separation layer.

(Dry Etching Conditions)
Equipment: U-621 (manufactured by Hitachi High-Tech Corporation)
Gas used: mixed gas of $CF_4$ and $C_4F_6$
Gas flow rate: $CF_4/C_4F_6$=350 ml/min/50 ml/min
Radio frequency (RF) power: 1000 W
Antenna bias: 400 W
Wafer bias: 400 W
Electrode height: 68 mm Pressure: 2.0 Pa
Etching time: 500 seconds
Substrate temperature: 20° C.

Next, an optical waveguide layer having a thickness of 0.2 µm was formed on the surface of the microlens by the same method as in Example 1, thereby producing a structural body.

This structural body was excellent in light condensing property in the light detection layer (silicon photodiode). In addition, the variation in sensitivity characteristics (inhomogeneity of sensitivity) was small between the light detection layer near the center and the light detection layer near the periphery. By incorporating this structural body into a solid-state imaging element or an image display device, a clearer image could be obtained.

In Example 4, even in a case where a trapezoidal microlens was formed directly above the pixels of each color of the color separation layer, and an optical waveguide layer having a thickness of 0.2 µm was formed on the surface of the microlens by the same method as in Example 1 to produce a structural body, it was possible to form a structural body having the same effects as in Example 4.

Example 5

As a support, a silicon wafer having a diameter of 8 inches (20.32 cm) on which a silicon photodiode with element separation structure corresponding to 1.0 µm cell by Deep Trench had been formed was used. An interlayer (high refractive index material, $HfO_2$, film thickness: 0.10 µm) was formed on the surface of the silicon wafer on the side where the silicon photodiode had been formed. Thereafter, the interlayer was spin-coated with the composition for forming a partition wall described above, heated at 100° C. for 2 minutes using a hot plate, further heated at 230° C. for 2 minutes using a hot plate, thereby forming a partition wall material layer having a film thickness of 0.5 µm. The above-described partition wall material layer was further spin-coated with a composition for anti-reflection film (manufactured by Brewer Science, Inc., DUV42P) such that a film thickness after baking was 64 nm, heated at 200° C. for 1 minute, and cooled to 23° C., thereby forming an anti-reflection film. Next, the laminate was spin-coated with a positive type photoresist (FFPS-0283, manufactured by FUJIFILM Electronic Materials Co., Ltd.), and heated at 90° C. for 1 minute to form a photoresist layer having a thickness of 0.8 µm. Next, using a KrF scanner exposure machine (FPA6300ES6a, manufactured by Canon Inc.), after position detection by wafer alignment, the laminate was exposed with an exposure energy of 16 $J/cm^2$ through a mask, and heated at 100° C. for 1 minute. Thereafter, after developing for 1 minute with a developer (FHD-5, manufactured by FUJIFILM Electronic Materials Co., Ltd.), the laminate was heated at 100° C. for 1 minute to form a mesh-like pattern having a line width of 0.10 µm and a pitch width of 2.0 µm. Using this pattern as a photo mask, the laminate was patterned by a dry etching method under the conditions described in paragraph Nos. 0129 to 0130 of JP2016-014856A, thereby forming partition walls having a width of 0.10 µm and a height of 0.5 µm in a lattice form at intervals of 2.0 µm. The size of the opening of the partition wall on the silicon wafer was 1.90 µm in length and 1.90 µm in width. In addition, in the region of one section partitioned by the partition walls on the silicon wafer, a silicon photodiode for 4 pixels separated by Deep Trench was provided.

Next, the composition for forming a green pixel was applied to the support having the partition wall by a spin coating method, and heated at 100° C. for 2 minutes using a hot plate, thereby forming a green composition layer having a thickness of 0.6 µm. Next, using an i-ray stepper exposure device FPA-3000 i5+(manufactured by Canon Corporation), the above-described green composition layer was exposed at an exposure dose of 150 $mJ/cm^2$ through a mask in which 2.0 µm square openings (partition wall width between pixels: 0.10 µm, partition wall inner diameter: 1.90 µm) are Bayer-arranged. Next, puddle development was performed to the green composition layer at 23° C. for 60 seconds using a tetramethylammonium hydroxide (TMAH) 0.3% by mass aqueous solution. Thereafter, rinsing with a spin shower and washing with pure water were performed thereto, and the green composition layer was further heated at 200° C. for 5 minutes using a hot plate, thereby forming green pixels having a thickness of 0.5 µm and 2.0 µm square (partition wall width between pixels: 0.10 µm, partition wall inner diameter: 1.9 µm) in a region surrounded by the partition walls on the support. This green pixel was formed on the silicon photodiode for 4 pixels. The same operation was performed for the composition for forming a red pixel and the composition for forming a blue pixel, and a red pixel and a blue pixel were respectively formed in an area in which the pattern of the green pixel was removed, thereby a color separation layer consisting of the green pixel, the red pixel, and the blue pixel.

Next, the surface of the color separation layer was spin-coated with the composition for forming a flattening layer, and heated at 100° C. for 2 minutes and 200° C. for 5 minutes using a hot plate, thereby forming a flattening layer having a film thickness of 0.1 µm.

Next, using a magnetron sputtering device, $SiO_2$ was sputtered on the surface of the flattening layer to form an optical waveguide layer having a thickness of 0.9 µm, thereby producing a structural body shown in FIG. 12. This optical waveguide layer was a layer in which a plurality of columnar structural bodies of $SiO_2$ were arranged at an angle of 0° to 0.5° with respect to a normal line of a light receiving surface of the support. In addition, the average diameter of the columnar structural bodies was 50 nm, and the gap between the columnar structural bodies was 1 nm.

This structural body was excellent in light condensing property in the light detection layer (silicon photodiode). By incorporating this structural body into a solid-state imaging element or an image display device, excellent light-receiving sensitivity was obtained.

In the present examples, a structural body in which the partition wall formed by using the composition for forming a partition wall including colloidal silica particles is provided between the color separation layers is shown. However, the present invention can also be applied to a structural body using a partition wall in which a metal (tungsten, aluminum, and the like) and a low refractive index material are laminated, a metal partition wall, or a partition wall including an organic pigment such as a black matrix, instead of this partition wall. In addition, the present invention can also be applied to a structural body in which no partition wall is provided between the color separation layers.

EXPLANATION OF REFERENCES

1, 1a: support
2, 2a: partition wall
10, 11: light detection layer
10a, 11a: light receiving surface
20a, 20b, 20c, 21a, 21b, 21c: pixel
20, 21: color separation layer 30: optical waveguide layer
40: microlens
101 to 107: structural body

What is claimed is:

1. A structural body comprising:
a light detection layer;
a color separation layer provided on a light incident side of the light detection layer; and
an optical waveguide layer provided on the light incident side of the light detection layer and provided on at least one selected from a light incident side of the color separation layer or a light transmitting side of the color separation layer,
wherein the optical waveguide layer is a layer which transmits light incident at an angle of 0° to 40° with respect to a normal line of a light receiving surface of the light detection layer by changing a traveling angle of the incident light to an angle of 0° to 1° with respect to the normal line of the light receiving surface of the light detection layer,
the optical waveguide layer is a layer in which a plurality of columnar structural bodies are arranged at an angle of 0° to 1.0° with respect to the normal line of the light receiving surface of the light detection layer,
an average diameter of the columnar structural bodies is 90 nm or less, and
a gap between the columnar structural bodies is 2 nm or less.

2. The structural body according to claim 1,
wherein the optical waveguide layer is provided on the light incident side of the color separation layer.

3. The structural body according to claim 1, further comprising:
a microlens provided on the light incident side of the color separation layer.

4. The structural body according to claim 3,
wherein the optical waveguide layer is provided on a surface of the microlens.

5. The structural body according to claim 3,
wherein the optical waveguide layer is provided between the microlens and the color separation layer.

6. The structural body according to claim 1,
wherein the columnar structural bodies include at least one selected from $SiO_2$ or magnesium fluoride.

7. The structural body according to claim 1,
wherein a surface of the optical waveguide layer on a light incident side is inclined or curved toward a predetermined direction of the structural body.

8. The structural body according to claim 1,
wherein a surface of the optical waveguide layer on a light incident side is inclined or curved to the light detection layer toward a center of a horizontal plane of the structural body.

9. The structural body according to claim 1,
wherein the color separation layer has a plurality of pixels.

10. The structural body according to claim 9,
wherein a partition wall is provided between each pixel.

11. The structural body according to claim 10,
wherein a refractive index of the partition wall with respect to light having a wavelength of 633 nm is 1.4 or less.

12. The structural body according to claim 10,
wherein the partition wall includes silica particles.

13. The structural body according to claim 1, further comprising:
a flattening layer provided on at least one surface selected from a surface of the optical waveguide layer on a light incident side or a surface of the optical waveguide layer on a light transmitting side.

14. The structural body according to claim 1,
wherein a surface of the structural body on a light incident side is curved.

15. The structural body according to claim 1,
wherein the color separation layer is divided into a plurality of parts, and
the color separation layer has two or more different types of pixels, and the same type of pixel is formed over a plurality of adjacent light detection layers.

16. A solid-state imaging element comprising:
the structural body according to claim 1.

17. An image display device comprising:
the structural body according to claim 1.

18. The structural body according to claim 1,
wherein a surface of the optical waveguide layer on the light incident side is inclined stepwise or graduated toward a predetermined direction of the structural body.

* * * * *